US012689306B2

(12) United States Patent
Luo et al.

(10) Patent No.: US 12,689,306 B2
(45) Date of Patent: Jul. 21, 2026

(54) POWER MODULE INCLUDING SEMICONDUCTOR DEVICES

(71) Applicant: GM Global Technology Operations LLC, Detroit, MI (US)

(72) Inventors: Yilun Luo, Ann Arbor, MI (US); Chandra S. Namuduri, Troy, MI (US); Pengwei Li, Willington, CT (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 208 days.

(21) Appl. No.: 18/783,854

(22) Filed: Jul. 25, 2024

(65) Prior Publication Data

US 2026/0031739 A1 Jan. 29, 2026

(51) Int. Cl.
| | |
|---|---|
| *H05K 1/18* | (2026.01) |
| *H02M 7/00* | (2006.01) |
| *H05K 1/02* | (2006.01) |
| *H05K 1/181* | (2026.01) |
| *H10W 70/60* | (2026.01) |
| *H10W 70/685* | (2026.01) |
| *H10W 90/00* | (2026.01) |

(52) U.S. Cl.
CPC .......... *H02M 7/003* (2013.01); *H05K 1/0296* (2013.01); *H05K 1/181* (2013.01); *H10W 70/611* (2026.01); *H10W 70/685* (2026.01); *H10W 90/00* (2026.01)

(58) Field of Classification Search
CPC ..... H02M 7/003; H05K 1/0296; H05K 1/181; H10W 70/685; H10W 90/00; H10W 70/611
USPC ........................................................ 361/783
See application file for complete search history.

(56) References Cited

U.S. PATENT DOCUMENTS

| | | | | |
|---|---|---|---|---|
| 2024/0404981 A1* | 12/2024 | Yoshikawa | ......... | H10W 90/701 |
| 2025/0070055 A1* | 2/2025 | Lang | ................... | H10W 40/778 |
| 2025/0286010 A1* | 9/2025 | Maruyama | .......... | H10W 40/255 |

FOREIGN PATENT DOCUMENTS

DE 102017125601 A1 5/2018

* cited by examiner

*Primary Examiner* — Binh B Tran
(74) *Attorney, Agent, or Firm* — Vivacqua Crane, PLLC

(57) ABSTRACT

A power module may include a dielectric substrate and a plurality of conductors disposed on the dielectric substrate. The power module further may include a plurality of high-side semiconductor devices. A high-side conduction path length between a first terminal of each of the plurality of high-side semiconductor devices and a plurality of terminal ends of the plurality of conductors is equal. The power module further may include a plurality of low-side semiconductor devices. A low-side conduction path length between a second terminal of each of the plurality of low-side semiconductor devices and the plurality of terminal ends of the plurality of conductors is equal is equal.

20 Claims, 7 Drawing Sheets

POWER MODULE INCLUDING SEMICONDUCTOR DEVICES

INTRODUCTION

The present disclosure relates to a system and apparatus for power conversion, and more particularly, to power module systems and apparatuses for a vehicle.

To convert power in vehicle applications, power modules may be utilized. Power modules are self-contained power-electronic devices typically including semiconductor switches configured to be controllable to accomplish power conversion tasks such as, for example, direct current (DC) to alternating current (AC) conversion, AC to DC conversion, DC to DC conversion, and/or the like. In some examples, power modules are configured as a half-bridge with four semiconductor devices, allowing for DC to AC conversion. Multiple power modules may be used in tandem to provide multi-phase AC power to a load such as, for example, a traction motor of a vehicle. Design of power modules is complicated by high current requirements, high voltage requirements, high efficiency requirements, strict size, weight, and resource use constraints, strict electromagnetic interference (EMI) constraints, challenging environmental conditions, and various additional factors. Current power module designs may result in the semiconductor devices seeing unbalanced parasitic impedances, causing downstream effects such as, for example, increased switching loss, component damage, and EMI issues.

Thus, while current systems and apparatuses for power conversion achieve their intended purpose, there is a need for a new and improved power module system and apparatus for a vehicle.

SUMMARY

According to several aspects, a power module is provided. The power module may include a dielectric substrate. The power module further may include a plurality of conductors disposed on the dielectric substrate. The plurality of conductors includes one or more direct current (DC) positive conductors, one or more DC negative conductors, and one or more alternating current (AC) conductors. The power module further may include a plurality of terminal ends configured for connection to an external circuit. Each of the plurality of terminal ends is in electrical communication with one of the plurality of conductors. The power module further may include a plurality of high-side semiconductor devices disposed on the dielectric substrate. Each of the plurality of high-side semiconductor devices has a first terminal and a second terminal. The first terminal of each of the plurality of high-side semiconductor devices is connected to one of the one or more DC positive conductors. A high-side conduction path length between the first terminal of each of the plurality of high-side semiconductor devices and the plurality of terminal ends is equal. The second terminal of each of the plurality of high-side semiconductor devices is connected to one of the one or more AC conductors. The power module further may include a plurality of low-side semiconductor devices disposed on the dielectric substrate. Each of the plurality of low-side semiconductor devices has a first terminal and a second terminal. The first terminal of each of the plurality of low-side semiconductor devices is connected to one of the one or more AC conductors. The second terminal of each of the plurality of low-side semiconductor devices is connected to one of the one or more DC negative conductors. A low-side conduction path length between the second terminal of each of the plurality of low-side semiconductor devices and the plurality of terminal ends is equal.

In another aspect of the present disclosure, the plurality of conductors further may include a DC positive conductor, a first DC negative conductor, a second DC negative conductor, and an AC conductor. The plurality of terminal ends further may include a positive terminal end in electrical communication with the DC positive conductor, a first negative terminal end in electrical communication with the first DC negative conductor, and a second negative terminal end in electrical communication with the second DC negative conductor.

In another aspect of the present disclosure, the plurality of high-side semiconductor devices further may include a first high-side semiconductor device. The first terminal of the first high-side semiconductor device is connected to the DC positive conductor. The second terminal of the first high-side semiconductor device is connected to the AC conductor. The plurality of high-side semiconductor devices further may include a second high-side semiconductor device. The first terminal of the second high-side semiconductor device is connected to the DC positive conductor. The second terminal of the second high-side semiconductor device is connected to the AC conductor. A first high-side conduction path length between the first terminal of the first high-side semiconductor device and the positive terminal end is equal to a second high-side conduction path length between the first terminal of the second high-side semiconductor device and the positive terminal end.

In another aspect of the present disclosure, the plurality of low-side semiconductor devices further may include a first low-side semiconductor device. The first terminal of the first low-side semiconductor device is connected to the AC conductor. The second terminal of the first low-side semiconductor device is connected to the first DC negative conductor. The plurality of low-side semiconductor devices further may include a second low-side semiconductor device. The first terminal of the second low-side semiconductor device is connected to the AC conductor. The second terminal of the second low-side semiconductor device is connected to the second DC negative conductor. A first low-side conduction path length between the second terminal of the first low-side semiconductor device and the first negative terminal end is equal to a second low-side conduction path length between the second terminal of the second low-side semiconductor device and the second negative terminal end.

In another aspect of the present disclosure, the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge. The first high-side semiconductor device has a first edge and a second edge. The first terminal of the first high-side semiconductor device is disposed on the first edge of the first high-side semiconductor device and the second terminal of the first high-side semiconductor device is disposed on the second edge of the first high-side semiconductor device. The second high-side semiconductor device has a first edge and a second edge. The first terminal of the second high-side semiconductor device is disposed on the first edge of the second high-side semiconductor device and the second terminal of the second high-side semiconductor device is disposed on the second edge of the second high-side semiconductor device. The first low-side semiconductor device has a first edge and a second edge. The first terminal of the first low-side semiconductor device is disposed on the first edge of the first low-side semiconductor device and the second terminal of the first low-side semiconductor device is disposed on the second edge of the first low-side semiconductor device. The second low-side semiconductor device has a first edge and a second edge. The first terminal of the second low-side semiconductor device is disposed on the first edge of the second low-side semiconductor device and the second terminal of the second low-side semiconductor device is disposed on the second edge of the second low-side semiconductor device.

In another aspect of the present disclosure, the first high-side semiconductor device is oriented with the first edge of the first high-side semiconductor device parallel to the third edge of the dielectric substrate and with the second edge of the first high-side semiconductor device parallel to the first edge of the dielectric substrate. The second high-side semiconductor device is oriented with the first edge of the second high-side semiconductor device parallel to the first edge of the dielectric substrate and with the second edge of the second high-side semiconductor device parallel to the third edge of the dielectric substrate. The first low-side semiconductor device is oriented with the first edge of the first low-side semiconductor device parallel to the first edge of the dielectric substrate and with the second edge of the first low-side semiconductor device parallel to the third edge of the dielectric substrate. The second low-side semiconductor device is oriented with the first edge of the second low-side semiconductor device parallel to the third edge of the dielectric substrate and with the second edge of the second low-side semiconductor device parallel to the first edge of the dielectric substrate.

In another aspect of the present disclosure, the first high-side semiconductor device is oriented with the first edge of the first high-side semiconductor device parallel to the second edge of the dielectric substrate and with the second edge of the first high-side semiconductor device parallel to the fourth edge of the dielectric substrate. The second high-side semiconductor device is oriented with the first edge of the second high-side semiconductor device parallel to the second edge of the dielectric substrate and with the second edge of the second high-side semiconductor device parallel to the fourth edge of the dielectric substrate. The first low-side semiconductor device is oriented with the first edge of the first low-side semiconductor device parallel to the fourth edge of the dielectric substrate and with the second edge of the first low-side semiconductor device parallel to the second edge of the dielectric substrate. The second low-side semiconductor device is oriented with the first edge of the second low-side semiconductor device parallel to the fourth edge of the dielectric substrate and with the second edge of the second low-side semiconductor device parallel to the second edge of the dielectric substrate.

In another aspect of the present disclosure, the first high-side semiconductor device is oriented with the first edge of the first high-side semiconductor device parallel to the third edge of the dielectric substrate and with the second edge of the first high-side semiconductor device parallel to the first edge of the dielectric substrate. The second high-side semiconductor device is oriented with the first edge of the second high-side semiconductor device parallel to the first edge of the dielectric substrate and with the second edge of the second high-side semiconductor device parallel to the third edge of the dielectric substrate. The first low-side semiconductor device is oriented with the first edge of the first low-side semiconductor device parallel to the fourth edge of the dielectric substrate and with the second edge of the first low-side semiconductor device parallel to the second edge of the dielectric substrate. The second low-side semiconductor device is oriented with the first edge of the second low-side semiconductor device parallel to the fourth edge of the dielectric substrate and with the second edge of the second low-side semiconductor device parallel to the second edge of the dielectric substrate.

In another aspect of the present disclosure, the first high-side semiconductor device is oriented with the first edge of the first high-side semiconductor device parallel to the second edge of the dielectric substrate and with the second edge of the first high-side semiconductor device parallel to the fourth edge of the dielectric substrate. The second high-side semiconductor device is oriented with the first edge of the second high-side semiconductor device parallel to the second edge of the dielectric substrate and with the second edge of the second high-side semiconductor device parallel to the fourth edge of the dielectric substrate. The first low-side semiconductor device is oriented with the first edge of the first low-side semiconductor device parallel to the first edge of the dielectric substrate and with the second edge of the first low-side semiconductor device parallel to the third edge of the dielectric substrate. The second low-side semiconductor device is oriented with the first edge of the second low-side semiconductor device parallel to the third edge of the dielectric substrate and with the second edge of the second low-side semiconductor device parallel to the first edge of the dielectric substrate.

In another aspect of the present disclosure, each of the plurality of high-side semiconductor devices is mechanically connected to the plurality of conductors using soldering or sintering. Each of the plurality of low-side semiconductor devices is mechanically connected to the plurality of conductors using soldering or sintering.

According to several aspects, a power system for a vehicle is provided. The power system may include a rechargeable energy storage system (RESS) operable to provide direct current (DC) energy. The power system further may include a traction motor operable convert alternating current (AC) energy to mechanical energy to propel the vehicle. The power system further may include an inverter in electrical communication with the RESS and the traction motor and operable to convert the DC energy from the RESS to AC energy to power the traction motor. The inverter may include a dielectric substrate including at least one of: a direct bonded copper (DBC) substrate and an active metal brazed (AMB) substrate. The inverter further may include a DC positive conductor having a positive terminal end in electrical communication with the DC positive conductor and the RESS. The DC positive conductor is disposed on the dielectric substrate. The inverter further may include a DC negative conductor having a negative terminal end in electrical communication with the DC negative conductor and the RESS. The DC negative conductor is disposed on the dielectric substrate. The inverter further may include an AC conductor having an AC terminal end in electrical communication with the AC conductor and the traction motor. The AC conductor is disposed on the dielectric substrate. The inverter further may include a plurality of high-side semiconductor devices disposed on the dielectric substrate. Each of the plurality of high-side semiconductor devices has a first terminal and a second terminal. The first terminal of each of the plurality of high-side semiconductor devices is connected to the DC positive conductor. A high-side conduction path length between the first terminal of each of the plurality of high-side semiconductor devices and the positive terminal end is equal. The second terminal of each of the plurality of high-side semiconductor devices is connected to the AC conductor. The inverter further may include a plurality of low-side semiconductor devices disposed on the dielectric substrate. Each of the plurality of low-side semiconductor devices has a first terminal and a second terminal. The first terminal of each of the plurality of low-side semiconductor devices is connected to the AC conductor. The second terminal of each of the plurality of low-side semiconductor devices is connected to the DC negative conductor. A low-side conduction path length between the second terminal of each of the plurality of low-side semiconductor devices and the negative terminal end is equal.

In another aspect of the present disclosure, the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge. The plurality of high-side semiconductor devices each have a first edge and a second edge. The first terminal of each of the plurality of high-side semiconductor devices is disposed on the first edge of each of the plurality of high-side semiconductor devices and the second terminal of each of the plurality of high-side semiconductor devices is disposed on the second edge of each of the plurality of high-side semiconductor devices. The plurality of low-side semiconductor devices each have a first edge and a second edge. The first terminal of each of the plurality of low-side semiconductor devices is disposed on the first edge of each of the plurality of low-side semiconductor devices and the second terminal of each of the plurality of low-side semiconductor devices is disposed on the second edge of each of the plurality of low-side semiconductor devices.

In another aspect of the present disclosure, the plurality of high-side semiconductor devices are oriented with the first edge of each of the plurality of high-side semiconductor devices parallel to the third edge of the dielectric substrate and with the second edge of each of the plurality of high-side semiconductor devices parallel to the first edge of the dielectric substrate. The plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

In another aspect of the present disclosure, the plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate. The plurality of low-side semiconductor devices is oriented with the first edge of each of the plurality of low-side semiconductor devices parallel to the fourth edge of the dielectric substrate and with the second edge of each of the plurality of low-side semiconductor devices parallel to the second edge of the dielectric substrate.

In another aspect of the present disclosure, the plurality of high-side semiconductor devices are oriented with the first edge of each of the plurality of high-side semiconductor devices parallel to the third edge of the dielectric substrate and with the second edge of each of the plurality of high-side semiconductor devices parallel to the first edge of the dielectric substrate. The plurality of low-side semiconductor devices are oriented with the first edge of each of the plurality of low-side semiconductor devices parallel to the fourth edge of the dielectric substrate and with the second edge of each of the plurality of low-side semiconductor devices parallel to the second edge of the dielectric substrate.

In another aspect of the present disclosure, the plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate. The plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

In another aspect of the present disclosure, each of the plurality of high-side semiconductor devices is mechanically connected to the AC conductor. Each of the plurality of low-side semiconductor devices is mechanically connected to the DC negative conductor.

According to several aspects, an inverter for a vehicle is provided. The inverter may include a dielectric substrate including at least one of: a direct bonded copper (DBC) substrate and an active metal brazed (AMB) substrate. The inverter further may include a DC positive conductor having a positive terminal end in electrical communication with the DC positive conductor. The DC positive conductor is disposed on the dielectric substrate. The inverter further may include a DC negative conductor having a negative terminal end in electrical communication with the DC negative conductor. The DC negative conductor is disposed on the dielectric substrate. The inverter further may include an AC conductor having an AC terminal end in electrical communication with the AC conductor. The AC conductor is disposed on the dielectric substrate. The inverter further may include a plurality of high-side semiconductor devices disposed on the dielectric substrate. Each of the plurality of high-side semiconductor devices has a first terminal and a second terminal. The first terminal of each of the plurality of high-side semiconductor devices is connected to the DC positive conductor. A high-side conduction path length between the first terminal of each of the plurality of high-side semiconductor devices and the positive terminal end is equal. The second terminal of each of the plurality of high-side semiconductor devices is connected to the AC conductor. The inverter further may include a plurality of low-side semiconductor devices disposed on the dielectric substrate. Each of the plurality of low-side semiconductor devices has a first terminal and a second terminal. The first terminal of each of the plurality of low-side semiconductor devices is connected to the AC conductor. The second terminal of each of the plurality of low-side semiconductor devices is connected to the DC negative conductor. A low-side conduction path length between the second terminal of each of the plurality of low-side semiconductor devices and the negative terminal end is equal.

In another aspect of the present disclosure, the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge. The plurality of high-side semiconductor devices each have a first edge and a second edge. The first terminal of each of the plurality of high-side semiconductor devices is disposed on the first edge of each of the plurality of high-side semiconductor devices and the second terminal of each of the plurality of high-side semiconductor devices is disposed on the second edge of each of the plurality of high-side semiconductor devices. The plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate. The plurality of low-side semiconductor devices each have a first edge and a second edge. The first terminal of each of the plurality of low-side semiconductor devices is disposed on the first edge of each of the plurality of low-side semiconductor devices and the second terminal of each of the plurality of low-side semiconductor devices is disposed on the second edge of each of the plurality of low-side semiconductor devices. The plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

In another aspect of the present disclosure, each of the plurality of high-side semiconductor devices is mechanically connected to the AC conductor using soldering or sintering. Each of the plurality of low-side semiconductor devices is mechanically connected to the DC negative conductor using soldering or sintering.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
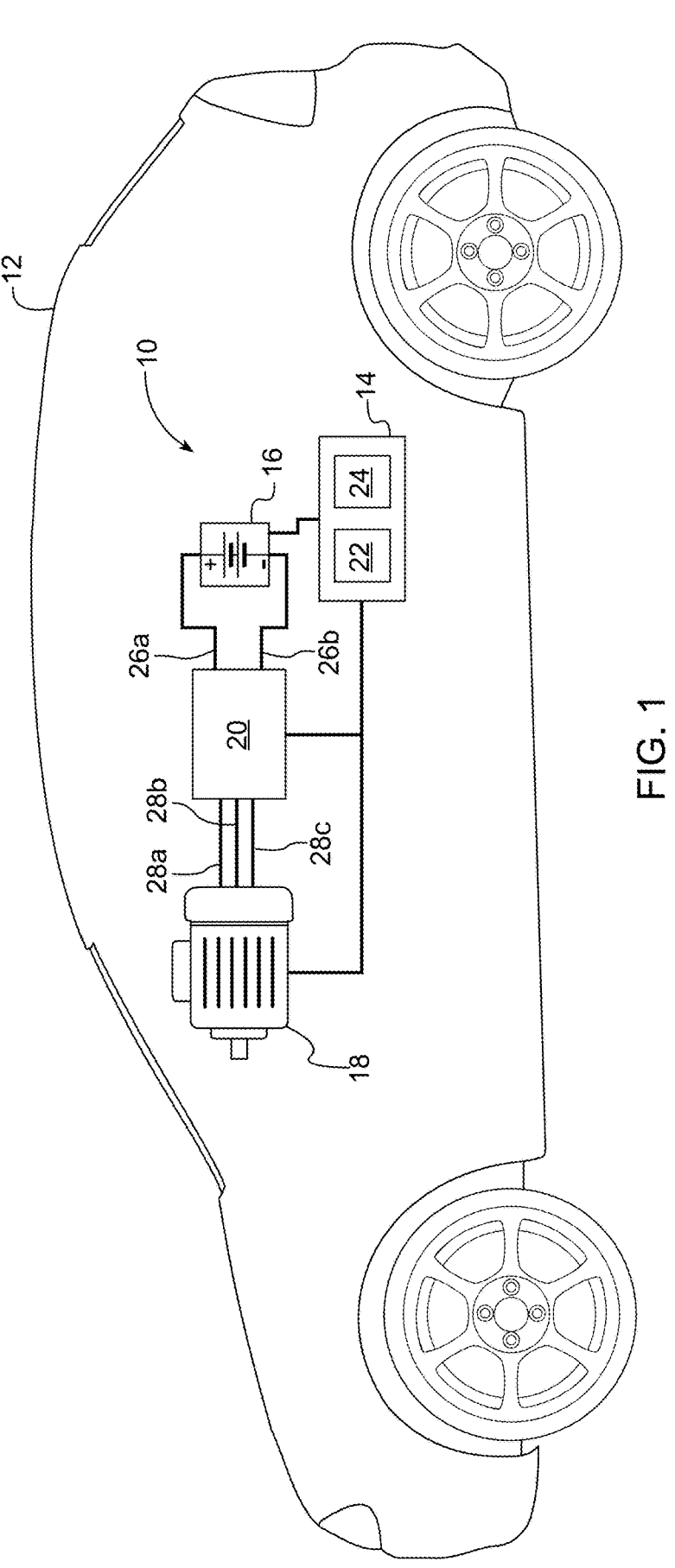
FIG. 1 is a schematic diagram of a power system for a vehicle, according to an exemplary embodiment.

Referring to FIG. 1, a power system for a vehicle is illustrated and generally indicated by reference number 10. The system 10 is shown with an exemplary vehicle 12. While a passenger vehicle is illustrated, it should be appreciated that the vehicle 12 may be any type of vehicle without departing from the scope of the present disclosure. The system 10 generally includes a controller 14, a rechargeable energy storage system (RESS) 16, a traction motor 18, and an inverter 20.

The controller 14 is used to control the RESS 16, the traction motor 18, and the inverter 20. The controller 14 includes at least one processor 22 and a non-transitory computer readable storage device or media 24. The processor 22 may be a custom made or commercially available processor, a central processing unit (CPU), a graphics processing unit (GPU), an auxiliary processor among several processors associated with the controller 14, a semiconductor-based microprocessor (in the form of a microchip or chip set), a macroprocessor, a combination thereof, or generally a device for executing instructions.

The computer readable storage device or media 24 may include volatile and nonvolatile storage in read-only memory (ROM), random-access memory (RAM), and keep-alive memory (KAM), for example. KAM is a persistent or non-volatile memory that may be used to store various operating variables while the processor 22 is powered down. The computer-readable storage device or media 24 may be implemented using a number of memory devices such as PROMs (programmable read-only memory), EPROMs (electrically PROM), EEPROMs (electrically erasable PROM), flash memory, or another electric, magnetic, optical, or combination memory devices capable of storing data, some of which represent executable instructions, used by the controller 14 to control various systems of the vehicle 12. The controller 14 may also consist of multiple controllers which are in electrical communication with each other.

The controller 14 is in electrical communication with the RESS 16, the traction motor 18, and the inverter 20. The controller 14 may also be inter-connected with additional systems and/or controllers of the vehicle 12, allowing the controller 14 to access data such as, for example, speed, acceleration, braking, and steering angle of the vehicle 12. In an exemplary embodiment, the electrical communication is established using, for example, a CAN network, a FLEXRAY network, a local area network (e.g., WiFi, ethernet, and the like), a serial peripheral interface (SPI) network, or the like. It should be understood that various additional wired and wireless techniques and communication protocols for communicating with the controller 14 are within the scope of the present disclosure. It should further be understood that, in the scope of the present disclosure, electrical communication also includes power and/or energy transfer between electrical devices (e.g., using conducting wires and/or wireless power transmission techniques).

The RESS 16 stores and provides electrical energy in the form of direct current (DC) energy for propulsion of the vehicle 12. In an exemplary embodiment, the RESS 16 includes a plurality of battery cells (e.g., lithium-ion battery cells) electrically connected in series and/or parallel to provide an increased voltage and/or current-carrying capacity. In a non-limiting example, the plurality of battery cells are housed in an enclosure configured to protect the plurality of battery cells from mechanical vibration, water intrusion, and dust intrusion. The enclosure is also configured to provide temperature regulation (e.g., using a liquid cooling system, a resistive heating system, and/or the like).

In an exemplary embodiment, the RESS 16 further includes a battery management system (BMS) in electrical communication with the controller 14 configured to monitor battery characteristics such as a state of charge (SOC), state of health (SOH), temperature, and/or the like, and transmit the battery characteristics to the controller 14. In a non-limiting example, the BMS includes a BMS controller in electrical communication with a plurality of BMS sensors disposed within the enclosure of the RESS 16. In another non-limiting example, the BMS further includes one or more electronic switches (e.g., relays, contactors, semiconductor-based switches, and/or the like) which are operable to interrupt current flow through the plurality of battery cells of the RESS 16 in response to commands received from the BMS controller and/or the controller 14. In an exemplary embodiment, the RESS 16 provides a DC voltage across a positive and negative output terminal. The positive and negative output terminals are electrically connected to the inverter 20 as will be discussed in greater detail below.

The traction motor 18 is used to convert electrical energy from the RESS 16 to mechanical energy (i.e., rotational energy) to propel the vehicle 12. In an exemplary embodiment, the traction motor 18 is a three-phase alternating current (AC) induction motor capable of converting AC energy to mechanical energy. In a non-limiting example, the traction motor 18 includes a stator having a plurality of stator windings and a rotor disposed rotatably within the stator having a plurality of rotor windings. The stator windings are excited by three-phase AC provided by the inverter 20 to produce a rotating stator magnetic field. The rotating stator magnetic field induces currents in the rotor windings, which in turn produces a rotor magnetic field which interacts with the rotating stator magnetic field causing the rotor to rotate. The amplitude, frequency, and/or relative phase shift of the excitation of each of the three phases of the stator windings controls speed, direction, and/or torque of the traction motor 18. The controller 14 is in electrical communication with the traction motor 18 for monitoring and/or control of the traction motor 18, for example, to measure a temperature, rotational speed, and/or the like of the traction motor 18.

The inverter 20 is used to convert the direct current (DC) energy provided by the RESS 16 to three-phase alternating current (AC) energy for use by the traction motor 18. In an exemplary embodiment, the inverter 20 includes a plurality of power semiconductor devices, such as, for example, insulated-gate bipolar transistors (IGBTs), metal-oxide semiconductor field-effect transistors (MOSFETs), and/or the like configured to convert DC to three-phase AC. In a non-limiting example, the inverter 20 functions by switching the plurality of power semiconductor devices in a pattern to generate an AC sinusoidal output for each of the three phases. The pattern may be adjusted to vary an amplitude, frequency, and/or relative phase shift of each of the three phases in order to control speed, direction, and/or torque of the traction motor 18 based on signals from the controller 14. The inverter 20 includes a DC positive terminal 26*a* and a DC negative terminal 26*b* electrically connected to the RESS 16. The inverter 20 further includes a first AC terminal

28*a*, a second AC terminal 28*b*, and a third AC terminal 28*c* electrically connected to the traction motor 18. The inverter 20 is in electrical communication with the controller 14, such that the controller 14 may enable, disable, and otherwise adjust the operation of the inverter 20. It should be understood that various types of inverters, including, for example, multi-level inverters, are within the scope of the present disclosure.

Figure 2:
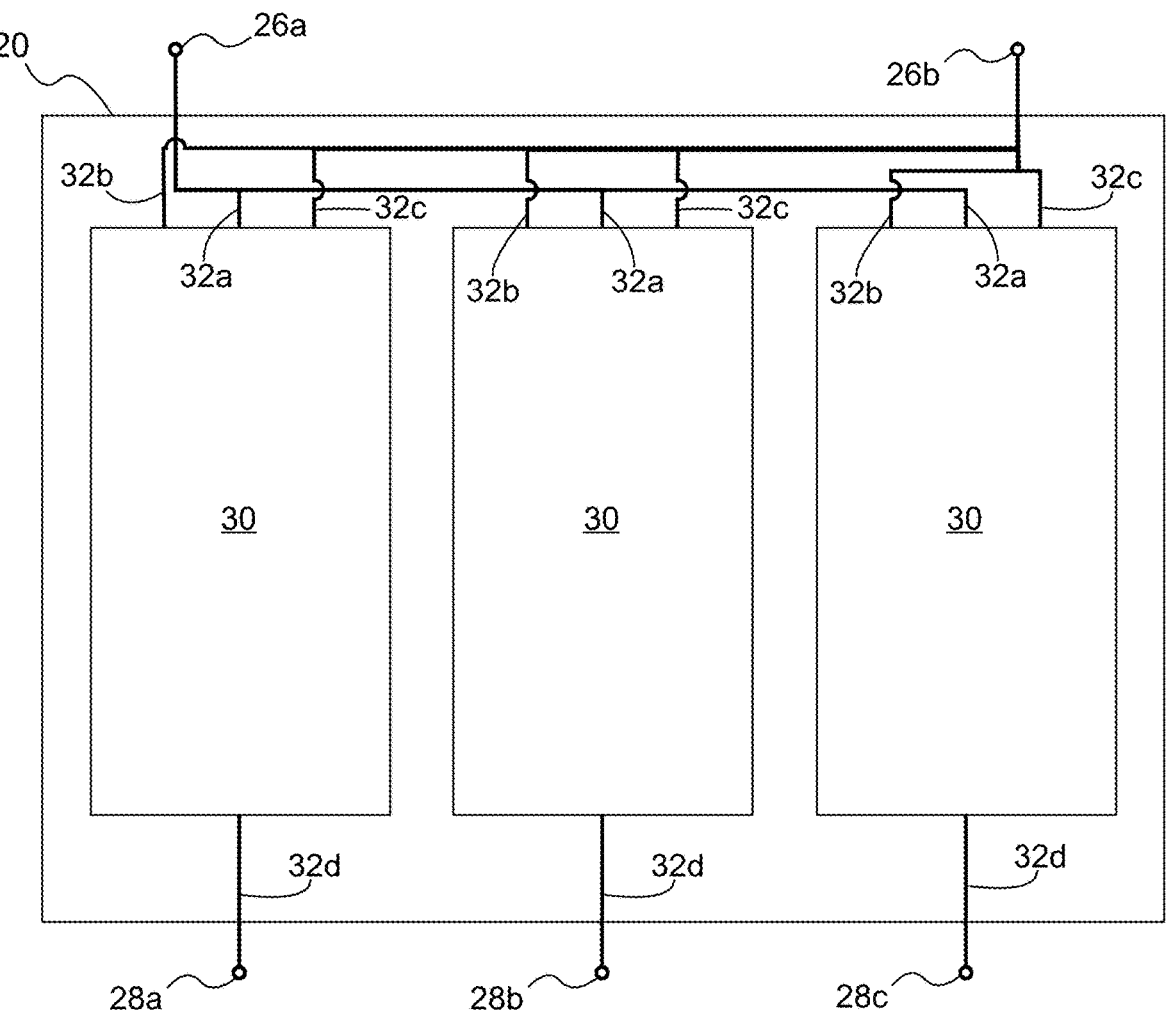
FIG. 2 is a schematic diagram of an inverter, according to an exemplary embodiment.

Referring to FIG. 2, a schematic diagram of the inverter 20 is shown. In an exemplary embodiment, the inverter 20 includes one or more power modules 30. In a non-limiting example shown in FIG. 2, the inverter 20 includes three power modules 30, with one power module 30 configured to produce each of the three AC phases. Each of the one or more power modules 30 includes a positive terminal end 32*a*, a first negative terminal end 32*b*, a second negative terminal end 32*c*, and an AC terminal end 32*d*. It should be understood that, in some embodiments, the positive terminal end 32*a*, the first negative terminal end 32*b*, the second negative terminal end 32*c*, and the AC terminal end 32*d* are interchangeable. The positive terminal end 32*a* of all of the one or more power modules 30 is connected in parallel to the DC positive terminal 26*a* of the inverter 20. The first negative terminal end 32*b* and the second negative terminal end 32*c* of all of the one or more power modules 30 is connected in parallel to the DC negative terminal 26*b* of the inverter 20. The AC terminal end 32*d* of each of the one or more power modules 30 is connected to one of the first AC terminal 28*a*, the second AC terminal 28*b*, and the third AC terminal 28*c*.

In reference to FIGS. 3-7, multiple exemplary embodiments of the power module 30 will be discussed. Elements which are common between all of the exemplary embodiments will be discussed first, followed by a discussion of differences between each of the exemplary embodiments. Referring to FIGS. 3-7, the power module 30 generally includes a dielectric substrate 40, a plurality of conductors 42, a plurality of high-side semiconductor devices 44*a*, a plurality of low-side semiconductor devices 44*b*, a temperature sensor 46, and an enclosure 48.

The dielectric substrate 40 is used to provide a mounting surface for the plurality of conductors 42, the plurality of high-side semiconductor devices 44*a*, and the plurality of low-side semiconductor devices 44*b*. In an exemplary embodiment, the dielectric substrate 40 is a direct bonded copper (DBC) substrate. In a non-limiting example, the DBC substrate includes a ceramic tile with the plurality of conductors 42 bonded to one side of the ceramic tile. In an exemplary embodiment, the plurality of conductors 42 are bonded by heating the plurality of conductors 42 and the ceramic tile in a controlled atmosphere such that a copper-oxygen eutectic forms, bonding the plurality of conductors 42 to the ceramic tile.

In another exemplary embodiment, the dielectric substrate 40 is an active metal brazed substrate (AMB). In a non-limiting example, the AMB substrate includes a ceramic tile with the plurality of conductors 42 bonded to one side of the ceramic tile. In an exemplary embodiment, the plurality of conductors 42 are bonded by soldering the plurality of conductors 42 to the ceramic tile in a low-pressure atmosphere (e.g., under vacuum) at a high temperature, bonding the plurality of conductors 42 to the ceramic tile.

In another exemplary embodiment, the dielectric substrate 40 is a printed circuit board (PCB). In a non-limiting example, the PCB is a laminated structure of conductive and insulating layers. Each of the conductive layers includes one or more of the plurality of conductors 42 etched from one or more sheet layers of copper. The conductive layers are laminated onto and/or between insulating layers. In a non-limiting example, the insulating layers are sheet layers of a non-conductive substrate, such as, for example, fiberglass-reinforced epoxy resin.

It should be understood that the dielectric substrate 40 may be any type of substrate suitable for power electronics without departing from the scope of the present disclosure. In an exemplary embodiment, the dielectric substrate 40 is a rectangle having a first edge 50a, a second edge 50b perpendicular to the first edge 50a, a third edge 50c parallel to the first edge 50a and perpendicular to the second edge 50b, and a fourth edge 50d parallel to the second edge 50b and perpendicular to the first edge 50a and the third edge 50c.

The plurality of conductors 42 are used to conduct current in the power module 30. In an exemplary embodiment, the plurality of conductors 42 are thin sheets of conductive material (e.g., copper) which are disposed on the dielectric substrate 40. The plurality of conductors 42 generally include one or more direct current (DC) positive conductors, one or more DC negative conductors, and one or more alternating current (AC) conductors. In a non-limiting example, the plurality of conductors 42 includes a DC positive conductor, a first DC negative conductor, a second DC negative conductor, and an AC conductor. The positive terminal end 32a is in electrical communication with the DC positive conductor. The first negative terminal end 32b is in electrical communication with the first DC negative conductor. The second negative terminal end 32c is in electrical communication with the second DC negative conductor. The AC terminal end 32d is in electrical communication with the AC conductor. In a non-limiting example, the positive terminal end 32a, the first negative terminal end 32b, the second negative terminal end 32c, and the AC terminal end 32d are configured for connection to an external circuit (e.g., using screw terminal connectors and/or the like). Exemplary configurations of the plurality of conductors 42 will be discussed in greater detail below.

The plurality of high-side semiconductor devices 44a are used to control a flow of electrical current between the DC positive conductor and the AC conductor. In an exemplary embodiment, the plurality of high-side semiconductor devices 44a includes a first high-side semiconductor device 52a and a second high-side semiconductor device 52b. The first high-side semiconductor device 52a has a first edge 54a and a second edge 54b. The first high-side semiconductor device 52a has a first terminal 56a disposed on the first edge 54a, a second terminal 56b disposed on the second edge 54b, and a control terminal (not shown) used to control current flow between the first terminal 56a and the second terminal 56b. In a non-limiting example, the terminals are electric connections to the semiconductor including, for example, a wire, a clip, ribbon bonding, or any combination thereof. The second high-side semiconductor device 52b has a first edge 58a and a second edge 58b. The second high-side semiconductor device 52b has a first terminal 60a disposed on the first edge 58a, a second terminal 60b disposed on the second edge 58b, and a control terminal (not shown) used to control current flow between the first terminal 60a and the second terminal 60b. In a non-limiting example, the terminals are electric connections to the semiconductor including, for example, a wire, a clip, ribbon bonding, or any combination thereof.

Generally, the first terminal 56a of the first high-side semiconductor device 52a is connected to the DC positive conductor, the second terminal 56b of the first high-side semiconductor device 52a is connected to the AC conductor, the first terminal 60a of the second high-side semiconductor device 52b is connected to the DC positive conductor, and the second terminal 60b of the second high-side semiconductor device 52b is connected to the AC conductor. The connections between the plurality of high-side semiconductor devices 44a and the plurality of conductors 42 will be discussed in greater detail below. In a non-limiting example, the control terminals are realized as pins extending orthogonally from the dielectric substrate 40 and electrically connected to the control terminals of the semiconductor devices using bonding wires. The control terminals are in electrical communication with the controller 14 to control the plurality of high-side semiconductor devices 44a. Any additional terminals (e.g., kelvin source terminals, current sensor terminals, temperature sensors terminals, and/or the like) may be realized in a similar manner to the control terminals as discussed above.

In a non-limiting example, the plurality of high-side semiconductor devices 44a includes one or more of a transistor, a thyristor, a triac, a GTO (gate turn-off thyristor), an IGBT (insulated gate bipolar transistor), MOSFET (metal-oxide-semiconductor field-effect transistor), SCR (silicon-controlled rectifier), and/or the like. For example, if the plurality of high-side semiconductor devices 44a are MOSFETs, the first terminals 56a, 60a are drain terminals, the second terminals 56b, 60b are source terminals, and the control terminals are gate terminals. The plurality of high-side semiconductor devices 44a further may include additional terminals (e.g., kelvin source terminals, current sensor terminals, temperature sensors terminals, and/or the like) without departing from the scope of the present disclosure. It should be understood that the plurality of high-side semiconductor devices 44a may include any semiconductor-based device operable to control current flow based on input to a control terminal.

The plurality of low-side semiconductor devices 44b are used to control a flow of electrical current between the DC negative conductor and the AC conductor. In an exemplary embodiment, the plurality of low-side semiconductor devices 44b includes a first low-side semiconductor device 62a and a second low-side semiconductor device 62b. The first low-side semiconductor device 62a has a first edge 64a and a second edge 64b. The first low-side semiconductor device 62a has a first terminal 66a disposed on the first edge 64a, a second terminal 66b disposed on the second edge 64b, and a control terminal (not shown) used to control current flow between the first terminal 66a and the second terminal 66b. In a non-limiting example, the terminals are electric connections to the semiconductor including, for example, a wire, a clip, ribbon bonding, or any combination thereof. The second low-side semiconductor device 62b has a first edge 68a and a second edge 68b. The second low-side semiconductor device 62b has a first terminal 70a disposed on the first edge 68a, a second terminal 70b disposed on the second edge 68b, and a control terminal (not shown) used to control current flow between the first terminal 70a and the second terminal 70b. In a non-limiting example, the terminals are electric connections to the semiconductor including, for example, a wire, a clip, ribbon bonding, or any combination thereof.

Generally, the first terminal 66a of the first low-side semiconductor device 62a is connected to the AC conductor, the second terminal 66b of the first low-side semiconductor device 62a is connected to the DC negative, the first terminal 70a of the second low-side semiconductor device 62b is connected to the AC conductor, and the second terminal 70b of the second low-side semiconductor device 62b is connected to the DC negative conductor. The connections between the plurality of low-side semiconductor devices 44b and the plurality of conductors 42 will be discussed in greater detail below. In a non-limiting example, the control terminals are realized as pins extending orthogonally from the dielectric substrate 40 and electrically connected to the control terminals of the semiconductor devices using bonding wires. The control terminals are in electrical communication with the controller 14 to control the plurality of low-side semiconductor devices 44b. Any additional terminals (e.g., kelvin source terminals, current sensor terminals, temperature sensors terminals, and/or the like) may be realized in a similar manner to the control terminals as discussed above.

In a non-limiting example, the plurality of low-side semiconductor devices 44b includes one or more of a transistor, a thyristor, a triac, a GTO (gate turn-off thyristor), a IGBT (insulated gate bipolar transistor), MOSFET (metal-oxide-semiconductor field-effect transistor), SCR (silicon-controlled rectifier), and/or the like. For example, if the plurality of low-side semiconductor devices 44b are MOSFETs, the first terminals 66a, 70a are drain terminals, the second terminals 66b, 70b are source terminals, and the control terminals are gate terminals. The plurality of low-side semiconductor devices 44b further may include additional terminals (e.g., kelvin source terminals, current sensor terminals, temperature sensors terminals, and/or the like) without departing from the scope of the present disclosure. It should be understood that the plurality of low-side semiconductor devices 44b may include any semiconductor-based device operable to control current flow based on input to a control terminal.

The temperature sensor 46 is used to measure temperature within the power module 30. In an exemplary embodiment, the temperature sensor 46 is a thermocouple, thermistor, resistance temperature detector (RTD), and/or the like in electrical communication with the controller 14. In a non-limiting example, the temperature sensor 46 is disposed on the dielectric substrate 40 and/or the plurality of conductors 42. In a non-limiting example, the temperature sensor 46 is in close proximity to the plurality of high-side semiconductor devices 44a and/or the plurality of low-side semiconductor devices 44b.

The enclosure 48 is used to house and protect the power module 30. In an exemplary embodiment, the enclosure 48 is a plastic, metal, and/or composite material configured to protect the dielectric substrate 40, the plurality of conductors 42, the plurality of high-side semiconductor devices 44a, the plurality of low-side semiconductor devices 44b, and the temperature sensor 46 from mechanical vibration, water intrusion, and dust intrusion. In a non-limiting example, the enclosure 48 electrically isolates the plurality of conductors 42. In another non-limiting example, the enclosure 48 transmits heat away from the plurality of high-side semiconductor devices 44a and the plurality of low-side semiconductor devices 44b. In some embodiments, such as the exemplary embodiments shown in FIGS. 3-7, the enclosure 48 is designed to contain one power module 30. In some embodiments, the enclosure 48 is designed to contain multiple power modules 30 (e.g., three power modules 30) within a single enclosure 48.

Figures 3A, 3B:
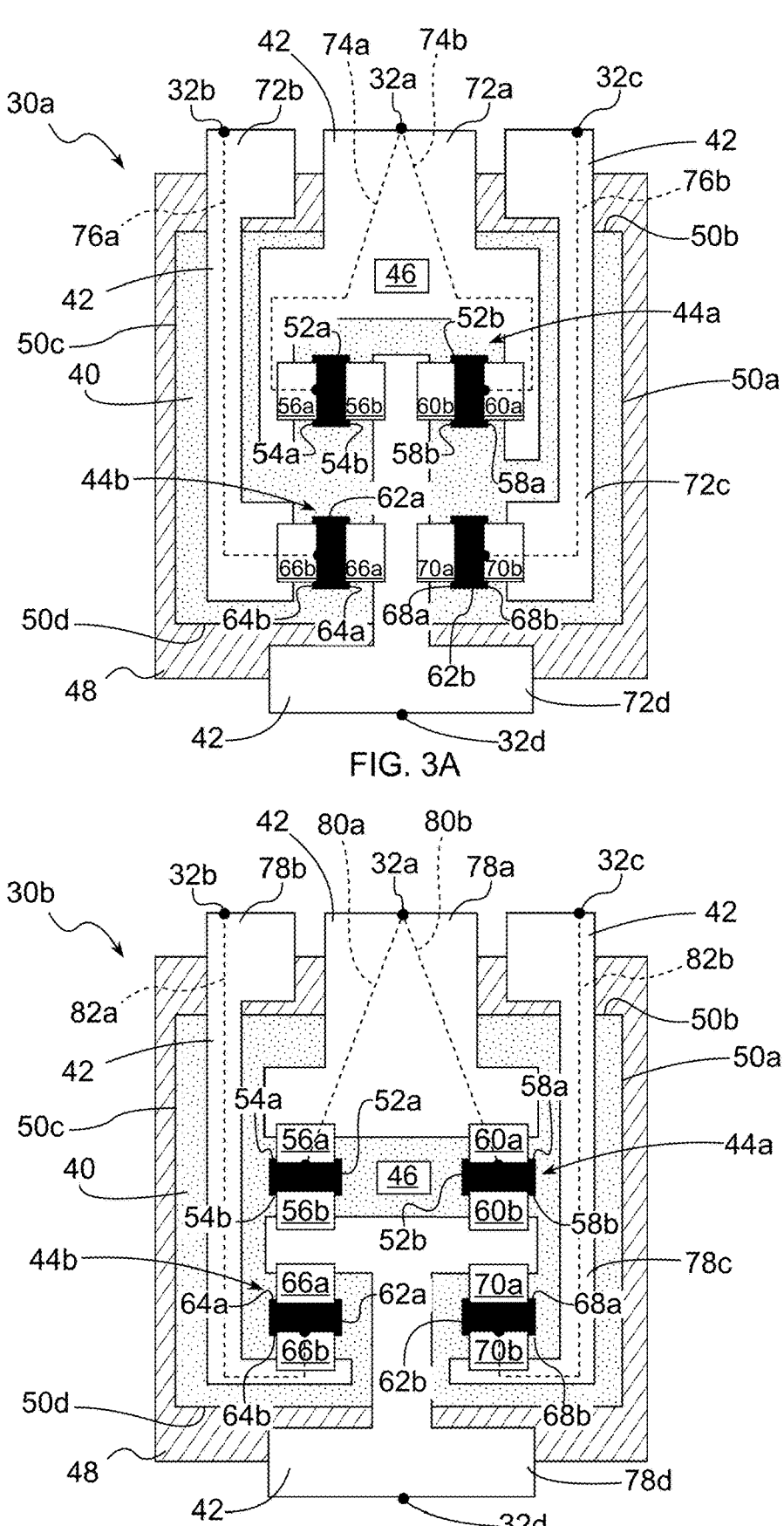
FIG. 3A is a schematic diagram of a first exemplary embodiment of a power module, according to an exemplary embodiment.
FIG. 3B is a schematic diagram of a second exemplary embodiment of the power module, according to an exemplary embodiment.

Referring to FIG. 3A, a schematic diagram of a first exemplary embodiment 30a of the power module 30 is shown. The first exemplary embodiment 30a of the power module 30 includes the dielectric substrate 40, the plurality of conductors 42, the plurality of high-side semiconductor devices 44a, the plurality of low-side semiconductor devices 44b, the temperature sensor 46, and the enclosure 48, as discussed above. In the first exemplary embodiment 30a of the power module 30, the plurality of conductors 42 includes a first exemplary DC positive conductor 72a, a first exemplary DC negative conductor 72b, a second exemplary DC negative conductor 72c, and a first exemplary AC conductor 72d disposed on the dielectric substrate as shown in FIG. 3A.

In the first exemplary embodiment 30a of the power module 30, the plurality of high-side semiconductor devices 44a are oriented as shown in FIG. 3A. More particularly, in the first exemplary embodiment 30a of the power module 30, the first high-side semiconductor device 52a is oriented with the first edge 54a of the first high-side semiconductor device 52a parallel to the third edge 50c of the dielectric substrate 40 and with the second edge 54b of the first high-side semiconductor device 52a parallel to the first edge 50a of the dielectric substrate 40. In the first exemplary embodiment 30a of the power module 30, the second high-side semiconductor device 52b is oriented with the first edge 58a of the second high-side semiconductor device 52b parallel to the first edge 50a of the dielectric substrate 40 and with the second edge 58b of the second high-side semiconductor device 52b parallel to the third edge 50c of the dielectric substrate 40.

In the first exemplary embodiment 30a of the power module 30, the first terminal 56a of the first high-side semiconductor device 52a and the first terminal 60a of the second high-side semiconductor device 52b are electrically connected to the first exemplary DC positive conductor 72a such that a first exemplary high-side conduction path length 74a between the first terminal 56a of the first high-side semiconductor device 52a and the positive terminal end 32a is equal to a second exemplary high-side conduction path length 74b between the first terminal 60a of the second high-side semiconductor device 52b and the positive terminal end 32a. In the scope of the present disclosure, a conduction path length is a mean length of a path along which electrons travel between two points. It should be understood that the shape and scale of the first exemplary high-side conduction path length 74a and the second exemplary high-side conduction path length 74b shown in FIG. 3A are merely exemplary in nature.

In an exemplary embodiment, the first exemplary DC positive conductor 72a is shaped symmetrically such that a first volume of conductor between the first terminal 56a of the first high-side semiconductor device 52a and the positive terminal end 32a is equal to a second volume of conductor between the first terminal 60a of the second high-side semiconductor device 52b and the positive terminal end 32a.

In an exemplary embodiment, the first exemplary DC positive conductor 72a is shaped symmetrically such that a first parasitic inductance measured between the first terminal 56a of the first high-side semiconductor device 52a and the positive terminal end 32a is equal to a second parasitic inductance measured between the first terminal 60a of the second high-side semiconductor device 52b and the positive terminal end 32a.

In the first exemplary embodiment 30a of the power module 30, the second terminal 56b of the first high-side semiconductor device 52a is electrically connected to the first exemplary AC conductor 72d. The second terminal 60b of the second high-side semiconductor device 52b is electrically connected to the first exemplary AC conductor 72d.

In the first exemplary embodiment 30a of the power module 30, the plurality of low-side semiconductor devices 44*b* are oriented as shown in FIG. 3A. More particularly, in the first exemplary embodiment 30*a* of the power module 30, the first low-side semiconductor device 62*a* is oriented with the first edge 64*a* of the first low-side semiconductor device 62*a* parallel to the first edge 50*a* of the dielectric substrate 40 and with the second edge 64*b* of the first low-side semiconductor device 62*a* parallel to the third edge 50*c* of the dielectric substrate 40. In the first exemplary embodiment 30*a* of the power module 30, the second low-side semiconductor device 62*b* is oriented with the first edge 68*a* of the second low-side semiconductor device 62*b* parallel to the third edge 50*c* of the dielectric substrate 40 and with the second edge 68*b* of the second low-side semiconductor device 62*b* parallel to the first edge 50*a* of the dielectric substrate 40.

In the first exemplary embodiment 30*a* of the power module 30, the second terminal 66*b* of the first low-side semiconductor device 62*a* is electrically connected to the first exemplary DC negative conductor 72*b*. The second terminal 70*b* of the second low-side semiconductor device 62*b* is electrically connected to the second exemplary DC negative conductor 72*c*. A first exemplary low-side conduction path length 76*a* between the second terminal 66*b* of the first low-side semiconductor device 62*a* and the first negative terminal end 32*b* is equal to a second exemplary low-side conduction path length 76*b* between the second terminal 70*b* of the second low-side semiconductor device 62*b* and the second negative terminal end 32*c*. It should be understood that the shape and scale of the first exemplary low-side conduction path length 76*a* and the second exemplary low-side conduction path length 76*b* shown in FIG. 3A are merely exemplary in nature.

In an exemplary embodiment, the first exemplary DC negative conductor 72*b* is shaped symmetrically with the second exemplary DC negative conductor 72*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the first exemplary DC negative conductor 72*b* is shaped symmetrically with the second exemplary DC negative conductor 72*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the first exemplary embodiment 30*a* of the power module 30, the first terminal 66*a* of the first low-side semiconductor device 62*a* is electrically connected to the first exemplary AC conductor 72*d*. The first terminal 70*a* of the second low-side semiconductor device 62*b* is electrically connected to the first exemplary AC conductor 72*d*.

Referring to FIG. 3B, a schematic diagram of a second exemplary embodiment 30*b* of the power module 30 is shown. The second exemplary embodiment 30*b* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the second exemplary embodiment 30*b* of the power module 30, the plurality of conductors 42 includes a second exemplary DC positive conductor 78*a*, a third exemplary DC negative conductor 78*b*, a fourth exemplary DC negative conductor 78*c*, and a second exemplary AC conductor 78*d* disposed on the dielectric substrate as shown in FIG. 3B.

In the second exemplary embodiment 30*b* of the power module 30, the plurality of high-side semiconductor devices 44*a* are oriented as shown in FIG. 3B. More particularly, in the second exemplary embodiment 30*b* of the power module 30, the first high-side semiconductor device 52*a* is oriented with the first edge 54*a* of the first high-side semiconductor device 52*a* parallel to the second edge 50*b* of the dielectric substrate 40 and with the second edge 54*b* of the first high-side semiconductor device 52*a* parallel to the fourth edge 50*d* of the dielectric substrate 40. In the second exemplary embodiment 30*b* of the power module 30, the second high-side semiconductor device 52*b* is oriented with the first edge 58*a* of the second high-side semiconductor device 52*b* parallel to the second edge 50*b* of the dielectric substrate 40 and with the second edge 58*b* of the second high-side semiconductor device 52*b* parallel to the fourth edge 50*d* of the dielectric substrate 40.

In the second exemplary embodiment 30*b* of the power module 30, the first terminal 56*a* of the first high-side semiconductor device 52*a* and the first terminal 60*a* of the second high-side semiconductor device 52*b* are electrically connected to the second exemplary DC positive conductor 78*a* such that a third exemplary high-side conduction path length 80*a* between the first terminal 56*a* of the first high-side semiconductor device 52*a* and the positive terminal end 32*a* is equal to a fourth exemplary high-side conduction path length 80*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the third exemplary high-side conduction path length 80*a* and the fourth exemplary high-side conduction path length 80*b* shown in FIG. 3B are merely exemplary in nature.

In an exemplary embodiment, the second exemplary DC positive conductor 78*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the second exemplary DC positive conductor 78*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the second exemplary embodiment 30*b* of the power module 30, the second terminal 56*b* of the first high-side semiconductor device 52*a* is electrically connected to the second exemplary AC conductor 78*d*. The second terminal 60*b* of the second high-side semiconductor device 52*b* is electrically connected to the second exemplary AC conductor 78*d*.

In the second exemplary embodiment 30*b* of the power module 30, the plurality of low-side semiconductor devices 44*b* are oriented as shown in FIG. 3B. More particularly, in the second exemplary embodiment 30*b* of the power module 30, the first low-side semiconductor device 62*a* is oriented with the first edge 64*a* of the first low-side semiconductor device 62*a* parallel to the fourth edge 50*d* of the dielectric substrate 40 and with the second edge 64*b* of the first low-side semiconductor device 62*a* parallel to the second edge 50*b* of the dielectric substrate 40. In the second exemplary embodiment 30*b* of the power module 30, the second low-side semiconductor device 62*b* is oriented with the first edge 68*a* of the second low-side semiconductor device 62*b* parallel to the fourth edge 50*d* of the dielectric substrate 40 and with the second edge 68*b* of the second low-side semiconductor device 62*b* parallel to the second edge 50*b* of the dielectric substrate 40.

In the second exemplary embodiment 30*b* of the power module 30, the second terminal 66*b* of the first low-side semiconductor device 62*a* is electrically connected to the third exemplary DC negative conductor 78*b*. The second terminal 70*b* of the second low-side semiconductor device 62*b* is electrically connected to the fourth exemplary DC negative conductor 78*c*. A third exemplary low-side conduction path length 82*a* between the second terminal 66*b* of the first low-side semiconductor device 62*a* and the first negative terminal end 32*b* is equal to a fourth exemplary low-side conduction path length 82*b* between the second terminal 70*b* of the second low-side semiconductor device 62*b* and the second negative terminal end 32*c*. It should be understood that the shape and scale of the third exemplary low-side conduction path length 82*a* and the fourth exemplary low-side conduction path length 82*b* shown in FIG. 3B are merely exemplary in nature.

In an exemplary embodiment, the third exemplary DC negative conductor 78*b* is shaped symmetrically with the fourth exemplary DC negative conductor 78*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the third exemplary DC negative conductor 78*b* is shaped symmetrically with the fourth exemplary DC negative conductor 78*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the second exemplary embodiment 30*b* of the power module 30, the first terminal 66*a* of the first low-side semiconductor device 62*a* is electrically connected to the second exemplary AC conductor 78*d*. The first terminal 70*a* of the second low-side semiconductor device 62*b* is electrically connected to the second exemplary AC conductor 78*d*.

Figure 4A:
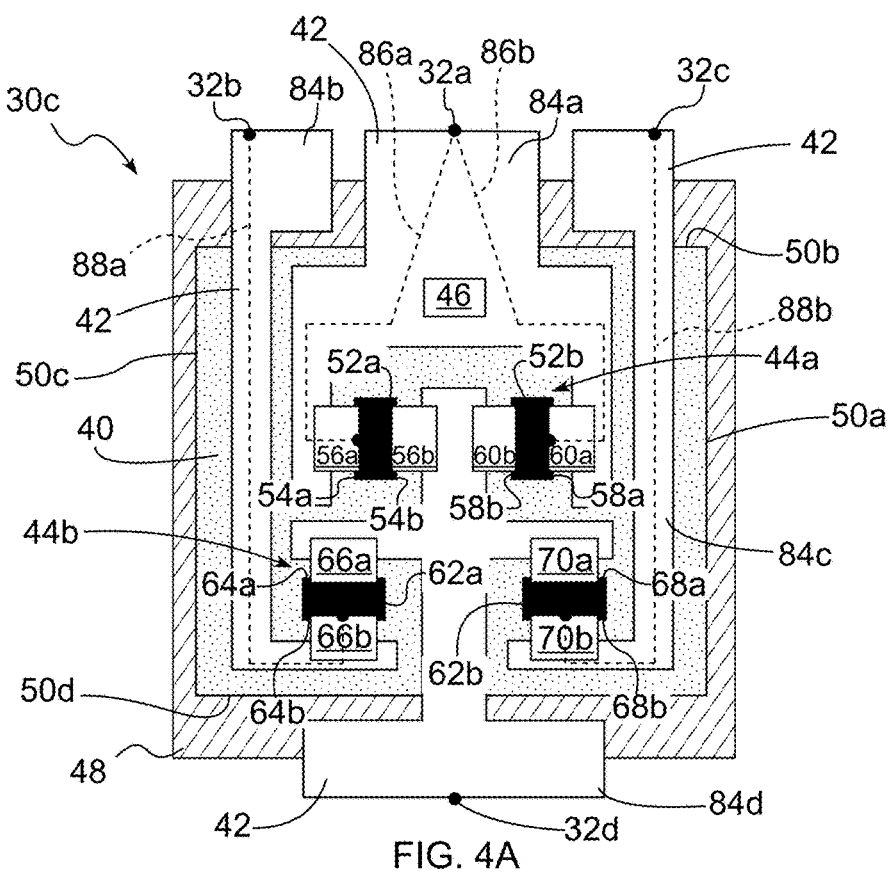
FIG. 4A is a schematic diagram of a third exemplary embodiment of the power module, according to an exemplary embodiment.

Referring to FIG. 4A, a schematic diagram of a third exemplary embodiment 30*c* of the power module 30 is shown. The third exemplary embodiment 30*c* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the third exemplary embodiment 30*c* of the power module 30, the plurality of conductors 42 includes a third exemplary DC positive conductor 84*a*, a fifth exemplary DC negative conductor 84*b*, a sixth exemplary DC negative conductor 84*c*, and a third exemplary AC conductor 84*d* disposed on the dielectric substrate as shown in FIG. 4A.

In the third exemplary embodiment 30*c* of the power module 30, the plurality of high-side semiconductor devices

44*a* are oriented as shown in FIG. 4A. More particularly, in the third exemplary embodiment 30*c* of the power module 30, the first high-side semiconductor device 52*a* is oriented with the first edge 54*a* of the first high-side semiconductor device 52*a* parallel to the third edge 50*c* of the dielectric substrate 40 and with the second edge 54*b* of the first high-side semiconductor device 52*a* parallel to the first edge 50*a* of the dielectric substrate 40. In the third exemplary embodiment 30*c* of the power module 30, the second high-side semiconductor device 52*b* is oriented with the first edge 58*a* of the second high-side semiconductor device 52*b* parallel to the first edge 50*a* of the dielectric substrate 40 and with the second edge 58*b* of the second high-side semiconductor device 52*b* parallel to the third edge 50*c* of the dielectric substrate 40.

In the third exemplary embodiment 30*c* of the power module 30, the first terminal 56*a* of the first high-side semiconductor device 52*a* and the first terminal 60*a* of the second high-side semiconductor device 52*b* are electrically connected to the third exemplary DC positive conductor 84*a* such that a fifth exemplary high-side conduction path length 86*a* between the first terminal 56*a* of the first high-side semiconductor device 52*a* and the positive terminal end 32*a* is equal to a sixth exemplary high-side conduction path length 86*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the fifth exemplary high-side conduction path length 86*a* and the sixth exemplary high-side conduction path length 86*b* shown in FIG. 4A are merely exemplary in nature.

In an exemplary embodiment, the third exemplary DC positive conductor 84*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the third exemplary DC positive conductor 84*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the third exemplary embodiment 30*c* of the power module 30, the second terminal 56*b* of the first high-side semiconductor device 52*a* is electrically connected to the third exemplary AC conductor 84*d*. The second terminal 60*b* of the second high-side semiconductor device 52*b* is electrically connected to the third exemplary AC conductor 84*d*.

In the third exemplary embodiment 30*c* of the power module 30, the plurality of low-side semiconductor devices 44*b* are oriented as shown in FIG. 4A. More particularly, in the third exemplary embodiment 30*c* of the power module 30, the first low-side semiconductor device 62*a* is oriented with the first edge 64*a* of the first low-side semiconductor device 62*a* parallel to the fourth edge 50*d* of the dielectric substrate 40 and with the second edge 64*b* of the first low-side semiconductor device 62*a* parallel to the second edge 50*b* of the dielectric substrate 40. In the third exemplary embodiment 30*c* of the power module 30, the second low-side semiconductor device 62*b* is oriented with the first edge 68*a* of the second low-side semiconductor device 62*b* parallel to the fourth edge 50*d* of the dielectric substrate 40 and with the second edge 68*b* of the second low-side semiconductor device 62*b* parallel to the second edge 50*b* of the dielectric substrate 40.

In the third exemplary embodiment 30*c* of the power module 30, the second terminal 66*b* of the first low-side semiconductor device 62*a* is electrically connected to the fifth exemplary DC negative conductor 84*b*. The second terminal 70*b* of the second low-side semiconductor device 62*b* is electrically connected to the sixth exemplary DC negative conductor 84*c*. A fifth exemplary low-side conduction path length 88*a* between the second terminal 66*b* of the first low-side semiconductor device 62*a* and the first negative terminal end 32*b* is equal to a sixth exemplary low-side conduction path length 88*b* between the second terminal 70*b* of the second low-side semiconductor device 62*b* and the second negative terminal end 32*c*. It should be understood that the shape and scale of the fifth exemplary low-side conduction path length 88*a* and the sixth exemplary low-side conduction path length 88*b* shown in FIG. 4A are merely exemplary in nature.

In an exemplary embodiment, the fifth exemplary DC negative conductor 84*b* is shaped symmetrically with the sixth exemplary DC negative conductor 84*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the fifth exemplary DC negative conductor 84*b* is shaped symmetrically with the sixth exemplary DC negative conductor 84*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the third exemplary embodiment 30*c* of the power module 30, the first terminal 66*a* of the first low-side semiconductor device 62*a* is electrically connected to the third exemplary AC conductor 84*d*. The first terminal 70*a* of the second low-side semiconductor device 62*b* is electrically connected to the third exemplary AC conductor 84*d*.

Figure 4B:
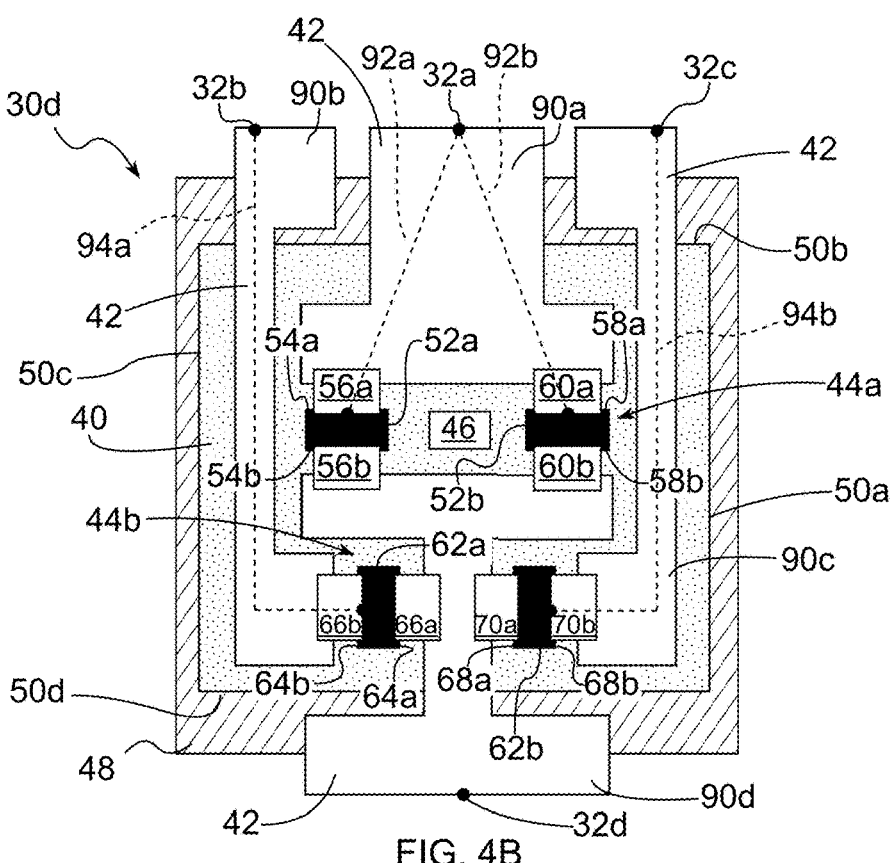
FIG. 4B is a schematic diagram of a fourth exemplary embodiment of the power module, according to an exemplary embodiment.

Referring to FIG. 4B, a schematic diagram of a fourth exemplary embodiment 30*d* of the power module 30 is shown. The fourth exemplary embodiment 30*d* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the fourth exemplary embodiment 30*d* of the power module 30, the plurality of conductors 42 includes a fourth exemplary DC positive conductor 90*a*, a seventh exemplary DC negative conductor 90*b*, an eighth exemplary DC negative conductor 90*c*, and a fourth exemplary AC conductor 90*d* disposed on the dielectric substrate as shown in FIG. 4B.

In the fourth exemplary embodiment 30*d* of the power module 30, the plurality of high-side semiconductor devices 44*a* are oriented as shown in FIG. 4B. More particularly, in the fourth exemplary embodiment 30*d* of the power module 30, the first high-side semiconductor device 52*a* is oriented with the first edge 54*a* of the first high-side semiconductor device 52*a* parallel to the second edge 50*b* of the dielectric substrate 40 and with the second edge 54*b* of the first high-side semiconductor device 52*a* parallel to the fourth edge 50*d* of the dielectric substrate 40. In the fourth exemplary embodiment 30*d* of the power module 30, the second high-side semiconductor device 52*b* is oriented with the first edge 58*a* of the second high-side semiconductor device 52*b* parallel to the second edge 50*b* of the dielectric substrate 40 and with the second edge 58*b* of the second high-side semiconductor device 52*b* parallel to the fourth edge 50*d* of the dielectric substrate 40.

In the fourth exemplary embodiment 30*d* of the power module 30, the first terminal 56*a* of the first high-side semiconductor device 52*a* and the first terminal 60*a* of the second high-side semiconductor device 52*b* are electrically connected to the fourth exemplary DC positive conductor 90*a* such that a seventh exemplary high-side conduction path length 92*a* between the first terminal 56*a* of the first high-side semiconductor device 52*a* and the positive terminal end 32*a* is equal to an eighth exemplary high-side conduction path length 92*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the seventh exemplary high-side conduction path length 92*a* and the eighth exemplary high-side conduction path length 92*b* shown in FIG. 4B are merely exemplary in nature.

In an exemplary embodiment, the fourth exemplary DC positive conductor 90*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the fourth exemplary DC positive conductor 90*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the fourth exemplary embodiment 30*d* of the power module 30, the second terminal 56*b* of the first high-side semiconductor device 52*a* is electrically connected to the fourth exemplary AC conductor 90*d*. The second terminal 60*b* of the second high-side semiconductor device 52*b* is electrically connected to the fourth exemplary AC conductor 90*d*.

In the fourth exemplary embodiment 30*d* of the power module 30, the plurality of low-side semiconductor devices 44*b* are oriented as shown in FIG. 4B. More particularly, in the fourth exemplary embodiment 30*d* of the power module 30, the first low-side semiconductor device 62*a* is oriented with the first edge 64*a* of the first low-side semiconductor device 62*a* parallel to the first edge 50*a* of the dielectric substrate 40 and with the second edge 64*b* of the first low-side semiconductor device 62*a* parallel to the third edge 50*c* of the dielectric substrate 40. In the fourth exemplary embodiment 30*d* of the power module 30, the second low-side semiconductor device 62*b* is oriented with the first edge 68*a* of the second low-side semiconductor device 62*b* parallel to the third edge 50*c* of the dielectric substrate 40 and with the second edge 68*b* of the second low-side semiconductor device 62*b* parallel to the first edge 50*a* of the dielectric substrate 40.

In the fourth exemplary embodiment 30*d* of the power module 30, the second terminal 66*b* of the first low-side semiconductor device 62*a* is electrically connected to the seventh exemplary DC negative conductor 90*b*. The second terminal 70*b* of the second low-side semiconductor device 62*b* is electrically connected to the eighth exemplary DC negative conductor 90*c*. A seventh exemplary low-side conduction path length 94*a* between the second terminal 66*b* of the first low-side semiconductor device 62*a* and the first negative terminal end 32*b* is equal to an eighth exemplary low-side conduction path length 94*b* between the second terminal 70*b* of the second low-side semiconductor device 62*b* and the second negative terminal end 32*c*. It should be understood that the shape and scale of the seventh exemplary low-side conduction path length 94*a* and the eighth exemplary low-side conduction path length 94*b* shown in FIG. 4B are merely exemplary in nature.

In an exemplary embodiment, the seventh exemplary DC negative conductor 90*b* is shaped symmetrically with the eighth exemplary DC negative conductor 90*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the seventh exemplary DC negative conductor 90*b* is shaped symmetrically with the eighth exemplary DC negative conductor 90*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the fourth exemplary embodiment 30*d* of the power module 30, the first terminal 66*a* of the first low-side semiconductor device 62*a* is electrically connected to the fourth exemplary AC conductor 90*d*. The first terminal 70*a* of the second low-side semiconductor device 62*b* is electrically connected to the fourth exemplary AC conductor 90*d*.

Figure 5A:
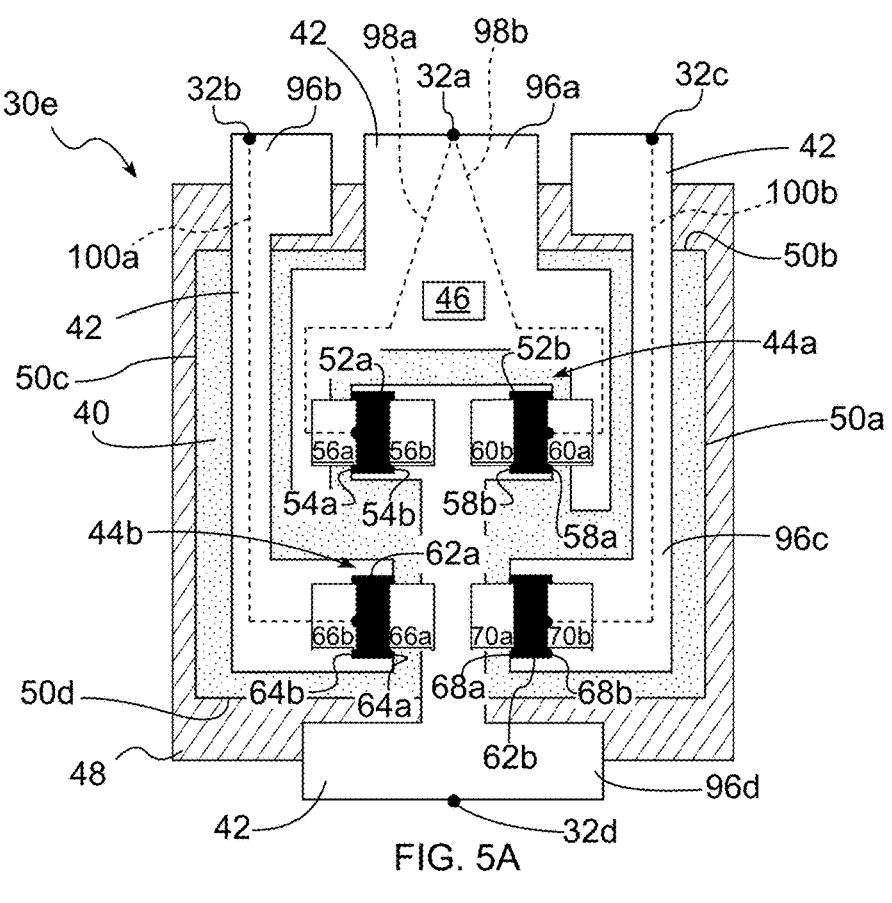
FIG. 5A is a schematic diagram of a fifth exemplary embodiment of the power module, according to an exemplary embodiment.

Referring to FIG. 5A, a schematic diagram of a fifth exemplary embodiment 30*e* of the power module 30 is shown. The fifth exemplary embodiment 30*e* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the fifth exemplary embodiment 30*e* of the power module 30, the plurality of conductors 42 includes a fifth exemplary DC positive conductor 96*a*, a ninth exemplary DC negative conductor 96*b*, a tenth exemplary DC negative conductor 96*c*, and a fifth exemplary AC conductor 96*d* disposed on the dielectric substrate as shown in FIG. 5A.

In the fifth exemplary embodiment 30*e* of the power module 30, the plurality of high-side semiconductor devices 44*a* are oriented as shown in FIG. 5A. More particularly, in the fifth exemplary embodiment 30*e* of the power module 30, the first high-side semiconductor device 52*a* is oriented with the first edge 54*a* of the first high-side semiconductor device 52*a* parallel to the third edge 50*c* of the dielectric substrate 40 and with the second edge 54*b* of the first high-side semiconductor device 52*a* parallel to the first edge 50*a* of the dielectric substrate 40. In the fifth exemplary embodiment 30*e* of the power module 30, the second high-side semiconductor device 52*b* is oriented with the first edge 58*a* of the second high-side semiconductor device 52*b* parallel to the first edge 50*a* of the dielectric substrate 40 and with the second edge 58*b* of the second high-side semiconductor device 52*b* parallel to the third edge 50*c* of the dielectric substrate 40.

In the fifth exemplary embodiment 30*e* of the power module 30, the first terminal 56*a* of the first high-side semiconductor device 52*a* and the first terminal 60*a* of the second high-side semiconductor device 52*b* are electrically connected to the fifth exemplary DC positive conductor 96*a* such that a ninth exemplary high-side conduction path length 98*a* between the first terminal 56*a* of the first high-side semiconductor device 52*a* and the positive terminal end 32*a* is equal to a tenth exemplary high-side conduction path length 98*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the ninth exemplary high-side conduction path length 98*a* and the tenth exemplary high-side conduction path length 98*b* shown in FIG. 5A are merely exemplary in nature.

In an exemplary embodiment, the fifth exemplary DC positive conductor 96*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the fifth exemplary DC positive conductor 96*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the fifth exemplary embodiment 30*e* of the power module 30, the second terminal 56*b* of the first high-side semiconductor device 52*a* is electrically connected to the fifth exemplary AC conductor 96*d*. The second terminal 60*b* of the second high-side semiconductor device 52*b* is electrically connected to the fifth exemplary AC conductor 96*d*. In the fifth exemplary embodiment 30*e* of the power module 30, the fifth exemplary AC conductor 96*d* is shaped such as to allow a mechanical connection between the fifth exemplary AC conductor 96*d* and the first high-side semiconductor device 52*a* and the second high-side semiconductor device 52*b*. In a non-limiting example, the first high-side semiconductor device 52*a* is mounted to the fifth exemplary AC conductor 96*d* using soldering or sintering. In a non-limiting example, the second high-side semiconductor device 52*b* is mounted to the fifth exemplary AC conductor 96*d* using soldering or sintering.

In the fifth exemplary embodiment 30*e* of the power module 30, the plurality of low-side semiconductor devices 44*b* are oriented as shown in FIG. 5A. More particularly, in the fifth exemplary embodiment 30*e* of the power module 30, the first low-side semiconductor device 62*a* is oriented with the first edge 64*a* of the first low-side semiconductor device 62*a* parallel to the first edge 50*a* of the dielectric substrate 40 and with the second edge 64*b* of the first low-side semiconductor device 62*a* parallel to the third edge 50*c* of the dielectric substrate 40. In the fifth exemplary embodiment 30*e* of the power module 30, the second low-side semiconductor device 62*b* is oriented with the first edge 68*a* of the second low-side semiconductor device 62*b* parallel to the third edge 50*c* of the dielectric substrate 40 and with the second edge 68*b* of the second low-side semiconductor device 62*b* parallel to the first edge 50*a* of the dielectric substrate 40.

In the fifth exemplary embodiment 30*e* of the power module 30, the second terminal 66*b* of the first low-side semiconductor device 62*a* is electrically connected to the ninth exemplary DC negative conductor 96*b*. The second terminal 70*b* of the second low-side semiconductor device 62*b* is electrically connected to the tenth exemplary DC negative conductor 96*c*. A ninth exemplary low-side conduction path length 100*a* between the second terminal 66*b* of the first low-side semiconductor device 62*a* and the first negative terminal end 32*b* is equal to a tenth exemplary low-side conduction path length 100*b* between the second terminal 70*b* of the second low-side semiconductor device 62*b* and the second negative terminal end 32*c*. It should be understood that the shape and scale of the ninth exemplary low-side conduction path length 100*a* and the tenth exemplary low-side conduction path length 100*b* shown in FIG. 5A are merely exemplary in nature.

In an exemplary embodiment, the ninth exemplary DC negative conductor 96*b* is shaped symmetrically with the tenth exemplary DC negative conductor 96*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the ninth exemplary DC negative conductor 96*b* is shaped symmetrically with the tenth exemplary DC negative conductor 96*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the fifth exemplary embodiment 30*e* of the power module 30, the ninth exemplary DC negative conductor 96*b* is shaped such as to allow a mechanical connection between the ninth exemplary DC negative conductor 96*b* and the first low-side semiconductor device 62*a*. The tenth exemplary DC negative conductor 96*c* is shaped such as to allow a mechanical connection between the tenth exemplary DC negative conductor 96*c* and the second low-side semiconductor device 62*b*. In a non-limiting example, the first low-side semiconductor device 62*a* is mounted to the ninth exemplary DC negative conductor 96*b* using soldering or sintering. In a non-limiting example, the second low-side semiconductor device 62*b* is mounted to the tenth exemplary DC negative conductor 96*c* using soldering or sintering.

In the fifth exemplary embodiment 30*e* of the power module 30, the first terminal 66*a* of the first low-side semiconductor device 62*a* is electrically connected to the fifth exemplary AC conductor 96*d*. The first terminal 70*a* of the second low-side semiconductor device 62*b* is electrically connected to the fifth exemplary AC conductor 96*d*.

Figure 5B:
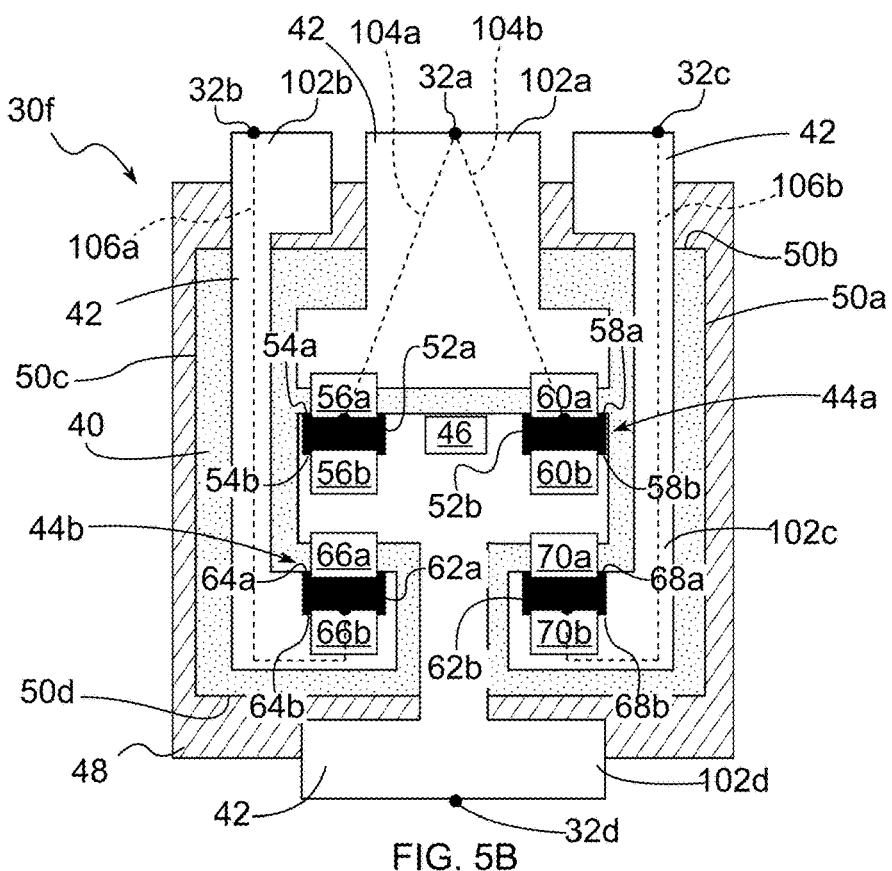
FIG. 5B is a schematic diagram of a sixth exemplary embodiment of the power module, according to an exemplary embodiment.

Referring to FIG. 5B, a schematic diagram of a sixth exemplary embodiment 30*f* of the power module 30 is shown. The sixth exemplary embodiment 30*f* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the sixth exemplary embodiment 30*f* of the power module 30, the plurality of conductors 42 includes a sixth exemplary DC positive conductor 102*a*, an eleventh exemplary DC negative conductor 102*b*, a twelfth exemplary DC negative conductor 102*c*, and a sixth exemplary AC conductor 102*d* disposed on the dielectric substrate as shown in FIG. 5B.

In the sixth exemplary embodiment 30*f* of the power module 30, the plurality of high-side semiconductor devices 44*a* are oriented as shown in FIG. 5B. More particularly, in the sixth exemplary embodiment 30*f* of the power module 30, the first high-side semiconductor device 52*a* is oriented with the first edge 54*a* of the first high-side semiconductor device 52*a* parallel to the second edge 50*b* of the dielectric substrate 40 and with the second edge 54*b* of the first high-side semiconductor device 52*a* parallel to the fourth edge 50*d* of the dielectric substrate 40. In the sixth exemplary embodiment 30*f* of the power module 30, the second high-side semiconductor device 52*b* is oriented with the first edge 58*a* of the second high-side semiconductor device 52*b* parallel to the second edge 50*b* of the dielectric substrate 40 and with the second edge 58*b* of the second high-side semiconductor device 52*b* parallel to the fourth edge 50*d* of the dielectric substrate 40.

In the sixth exemplary embodiment 30*f* of the power module 30, the first terminal 56*a* of the first high-side semiconductor device 52*a* and the first terminal 60*a* of the second high-side semiconductor device 52*b* are electrically connected to the sixth exemplary DC positive conductor 102*a* such that a eleventh exemplary high-side conduction path length 104*a* between the first terminal 56*a* of the first high-side semiconductor device 52*a* and the positive terminal end 32*a* is equal to a twelfth exemplary high-side conduction path length 104*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the eleventh exemplary high-side conduction path length 104*a* and the twelfth exemplary high-side conduction path length 104*b* shown in FIG. 5B are merely exemplary in nature.

In an exemplary embodiment, the sixth exemplary DC positive conductor 102*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the sixth exemplary DC positive conductor 102*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the sixth exemplary embodiment 30*f* of the power module 30, the second terminal 56*b* of the first high-side semiconductor device 52*a* is electrically connected to the sixth exemplary AC conductor 102*d*. The second terminal 60*b* of the second high-side semiconductor device 52*b* is electrically connected to the sixth exemplary AC conductor 102*d*. In the sixth exemplary embodiment 30*f* of the power module 30, the sixth exemplary AC conductor 102*d* is shaped such as to allow a mechanical connection between the sixth exemplary AC conductor 102*d* and the first high-side semiconductor device 52*a* and the second high-side semiconductor device 52*b*. In a non-limiting example, the first high-side semiconductor device 52*a* is mounted to the sixth exemplary AC conductor 102*d* using soldering or sintering. In a non-limiting example, the second high-side semiconductor device 52*b* is mounted to the sixth exemplary AC conductor 102*d* using soldering or sintering.

In the sixth exemplary embodiment 30*f* of the power module 30, the plurality of low-side semiconductor devices 44*b* are oriented as shown in FIG. 5B. More particularly, in the sixth exemplary embodiment 30*f* of the power module 30, the first low-side semiconductor device 62*a* is oriented with the first edge 64*a* of the first low-side semiconductor device 62*a* parallel to the fourth edge 50*d* of the dielectric substrate 40 and with the second edge 64*b* of the first low-side semiconductor device 62*a* parallel to the second edge 50*b* of the dielectric substrate 40. In the sixth exemplary embodiment 30*f* of the power module 30, the second low-side semiconductor device 62*b* is oriented with the first edge 68*a* of the second low-side semiconductor device 62*b* parallel to the fourth edge 50*d* of the dielectric substrate 40 and with the second edge 68*b* of the second low-side semiconductor device 62*b* parallel to the second edge 50*b* of the dielectric substrate 40.

In the sixth exemplary embodiment 30*f* of the power module 30, the second terminal 66*b* of the first low-side semiconductor device 62*a* is electrically connected to the eleventh exemplary DC negative conductor 102*b*. The second terminal 70*b* of the second low-side semiconductor device 62*b* is electrically connected to the twelfth exemplary DC negative conductor 102*c*. A eleventh exemplary low-side conduction path length 106*a* between the second terminal 66*b* of the first low-side semiconductor device 62*a* and the first negative terminal end 32*b* is equal to a twelfth exemplary low-side conduction path length 106*b* between the second terminal 70*b* of the second low-side semiconductor device 62*b* and the second negative terminal end 32*c*. It should be understood that the shape and scale of the eleventh exemplary low-side conduction path length 106*a* and the twelfth exemplary low-side conduction path length 106*b* shown in FIG. 5B are merely exemplary in nature.

In an exemplary embodiment, the eleventh exemplary DC negative conductor 102*b* is shaped symmetrically with the twelfth exemplary DC negative conductor 102*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the eleventh exemplary DC negative conductor 102*b* is shaped symmetrically with the twelfth exemplary DC negative conductor 102*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the sixth exemplary embodiment 30*f* of the power module 30, the eleventh exemplary DC negative conductor 102*b* is shaped such as to allow a mechanical connection with the first low-side semiconductor device 62*a*. The twelfth exemplary DC negative conductor 102*c* is shaped such as to allow a mechanical connection with the second low-side semiconductor device 62*b*. In a non-limiting example, the first low-side semiconductor device 62*a* is mounted to the eleventh exemplary DC negative conductor 102*b* using soldering or sintering. In a non-limiting example, the second low-side semiconductor device 62*b* is mounted to the twelfth exemplary DC negative conductor 102*c* using soldering or sintering.

In the sixth exemplary embodiment 30*f* of the power module 30, the first terminal 66*a* of the first low-side semiconductor device 62*a* is electrically connected to the sixth exemplary AC conductor 102*d*. The first terminal 70*a* of the second low-side semiconductor device 62*b* is electrically connected to the sixth exemplary AC conductor 102*d*.

Figure 6A:
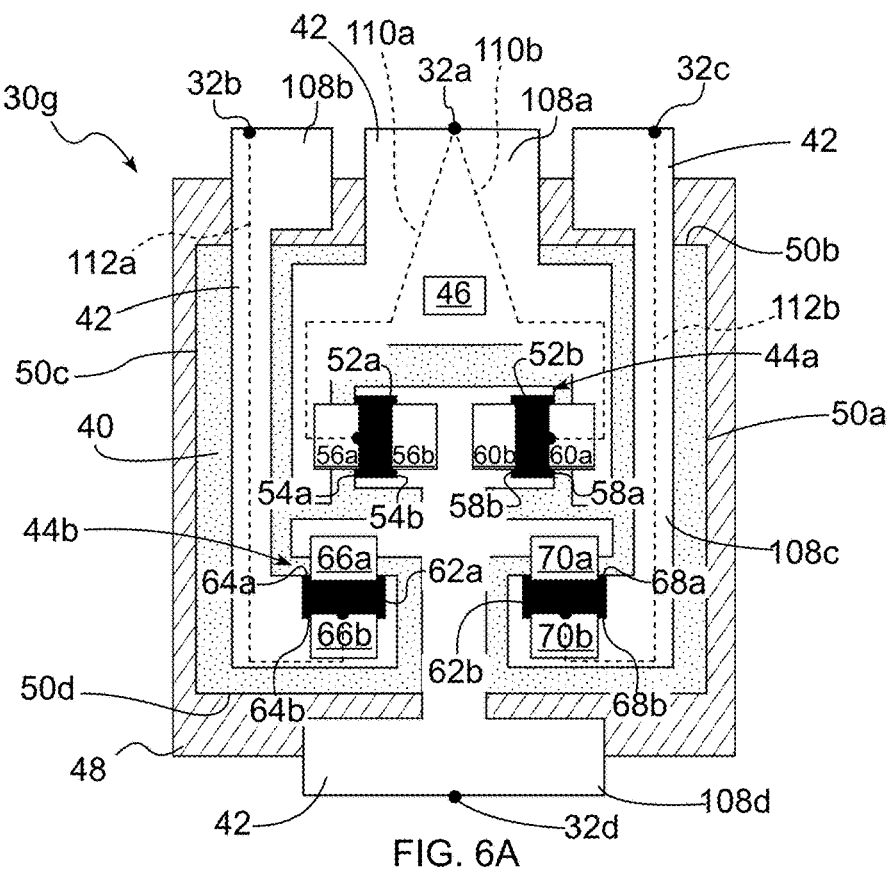
FIG. 6A is a schematic diagram of a seventh exemplary embodiment of the power module, according to an exemplary embodiment.

Referring to FIG. 6A, a schematic diagram of a seventh exemplary embodiment 30*g* of the power module 30 is shown. The seventh exemplary embodiment 30*g* of the power module 30 includes the dielectric substrate 40, the plurality of conductors 42, the plurality of high-side semiconductor devices 44*a*, the plurality of low-side semiconductor devices 44*b*, the temperature sensor 46, and the enclosure 48, as discussed above. In the seventh exemplary embodiment 30*g* of the power module 30, the plurality of conductors 42 includes a seventh exemplary DC positive conductor 108*a*, a thirteenth exemplary DC negative conductor 108*b*, a fourteenth exemplary DC negative conductor 108*c*, and a seventh exemplary AC conductor 108*d* disposed on the dielectric substrate as shown in FIG. 6A.

In the seventh exemplary embodiment 30*g* of the power module 30, the plurality of high-side semiconductor devices 44*a* are oriented as shown in FIG. 6A. More particularly, in the seventh exemplary embodiment 30*g* of the power module 30, the first high-side semiconductor device 52*a* is oriented with the first edge 54*a* of the first high-side semiconductor device 52*a* parallel to the third edge 50*c* of the dielectric substrate 40 and with the second edge 54*b* of the first high-side semiconductor device 52*a* parallel to the first edge 50*a* of the dielectric substrate 40. In the seventh exemplary embodiment 30*g* of the power module 30, the second high-side semiconductor device 52*b* is oriented with the first edge 58*a* of the second high-side semiconductor device 52*b* parallel to the first edge 50*a* of the dielectric substrate 40 and with the second edge 58*b* of the second high-side semiconductor device 52*b* parallel to the third edge 50*c* of the dielectric substrate 40.

In the seventh exemplary embodiment 30*g* of the power module 30, the first terminal 56*a* of the first high-side semiconductor device 52*a* and the first terminal 60*a* of the second high-side semiconductor device 52*b* are electrically connected to the seventh exemplary DC positive conductor 108*a* such that a thirteenth exemplary high-side conduction path length 110*a* between the first terminal 56*a* of the first high-side semiconductor device 52*a* and the positive terminal end 32*a* is equal to a fourteenth exemplary high-side conduction path length 110*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the thirteenth exemplary high-side conduction path length 110*a* and the fourteenth exemplary high-side conduction path length 110*b* shown in FIG. 6A are merely exemplary in nature.

In an exemplary embodiment, the seventh exemplary DC positive conductor 108*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the seventh exemplary DC positive conductor 108a is shaped symmetrically such that a first parasitic inductance measured between the first terminal 56a of the first high-side semiconductor device 52a and the positive terminal end 32a is equal to a second parasitic inductance measured between the first terminal 60a of the second high-side semiconductor device 52b and the positive terminal end 32a.

In the seventh exemplary embodiment 30g of the power module 30, the second terminal 56b of the first high-side semiconductor device 52a is electrically connected to the seventh exemplary AC conductor 108d. The second terminal 60b of the second high-side semiconductor device 52b is electrically connected to the seventh exemplary AC conductor 108d. In the seventh exemplary embodiment 30g of the power module 30, the seventh exemplary AC conductor 108d is shaped such as to allow a mechanical connection between the seventh exemplary AC conductor 108d and the first high-side semiconductor device 52a and the second high-side semiconductor device 52b. In a non-limiting example, the first high-side semiconductor device 52a is mounted to the seventh exemplary AC conductor 108d using soldering or sintering. In a non-limiting example, the second high-side semiconductor device 52b is mounted to the seventh exemplary AC conductor 108d using soldering or sintering.

In the seventh exemplary embodiment 30g of the power module 30, the plurality of low-side semiconductor devices 44b are oriented as shown in FIG. 6A. More particularly, in the seventh exemplary embodiment 30g of the power module 30, the first low-side semiconductor device 62a is oriented with the first edge 64a of the first low-side semiconductor device 62a parallel to the fourth edge 50d of the dielectric substrate 40 and with the second edge 64b of the first low-side semiconductor device 62a parallel to the second edge 50b of the dielectric substrate 40. In the seventh exemplary embodiment 30g of the power module 30, the second low-side semiconductor device 62b is oriented with the first edge 68a of the second low-side semiconductor device 62b parallel to the fourth edge 50d of the dielectric substrate 40 and with the second edge 68b of the second low-side semiconductor device 62b parallel to the second edge 50b of the dielectric substrate 40.

In the seventh exemplary embodiment 30g of the power module 30, the second terminal 66b of the first low-side semiconductor device 62a is electrically connected to the thirteenth exemplary DC negative conductor 108b. The second terminal 70b of the second low-side semiconductor device 62b is electrically connected to the fourteenth exemplary DC negative conductor 108c. A thirteenth exemplary low-side conduction path length 112a between the second terminal 66b of the first low-side semiconductor device 62a and the first negative terminal end 32b is equal to a fourteenth exemplary low-side conduction path length 112b between the second terminal 70b of the second low-side semiconductor device 62b and the second negative terminal end 32c. It should be understood that the shape and scale of the thirteenth exemplary low-side conduction path length 112a and the fourteenth exemplary low-side conduction path length 112b shown in FIG. 6A are merely exemplary in nature.

In an exemplary embodiment, the thirteenth exemplary DC negative conductor 108b is shaped symmetrically with the fourteenth exemplary DC negative conductor 108c such that a third volume of conductor between the second terminal 66b of the first low-side semiconductor device 62a and the first negative terminal end 32b is equal to a fourth volume of conductor between the second terminal 70b of the second low-side semiconductor device 62b and the second negative terminal end 32c.

In an exemplary embodiment, the thirteenth exemplary DC negative conductor 108b is shaped symmetrically with the fourteenth exemplary DC negative conductor 108c such that a third parasitic inductance measured between the second terminal 66b of the first low-side semiconductor device 62a and the first negative terminal end 32b is equal to a fourth parasitic inductance measured between the second terminal 70b of the second low-side semiconductor device 62b and the second negative terminal end 32c.

In the seventh exemplary embodiment 30g of the power module 30, the thirteenth exemplary DC negative conductor 108b is shaped such as to allow a mechanical connection between the thirteenth exemplary DC negative conductor 108b and the first low-side semiconductor device 62a. The fourteenth exemplary DC negative conductor 108c is shaped such as to allow a mechanical connection between the fourteenth exemplary DC negative conductor 108c and the second low-side semiconductor device 62b. In a non-limiting example, the first low-side semiconductor device 62a is mounted to the thirteenth exemplary DC negative conductor 108b using soldering or sintering. In a non-limiting example, the second low-side semiconductor device 62b is mounted to the fourteenth exemplary DC negative conductor 108c using soldering or sintering.

In the seventh exemplary embodiment 30g of the power module 30, the first terminal 66a of the first low-side semiconductor device 62a is electrically connected to the seventh exemplary AC conductor 108d. The first terminal 70a of the second low-side semiconductor device 62b is electrically connected to the seventh exemplary AC conductor 108d.

Figure 6B:
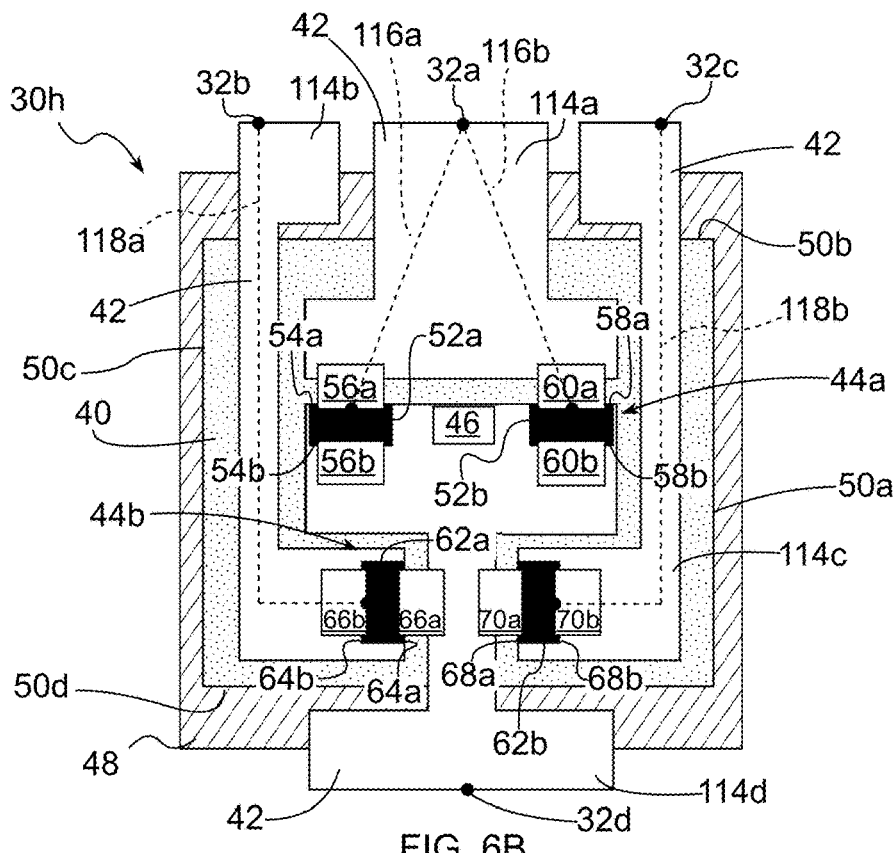
FIG. 6B is a schematic diagram of an eighth exemplary embodiment of the power module, according to an exemplary embodiment.

Referring to FIG. 6B, a schematic diagram of an eighth exemplary embodiment 30h of the power module 30 is shown. The eighth exemplary embodiment 30h of the power module 30 includes the dielectric substrate 40, the plurality of conductors 42, the plurality of high-side semiconductor devices 44a, the plurality of low-side semiconductor devices 44b, the temperature sensor 46, and the enclosure 48, as discussed above. In the eighth exemplary embodiment 30h of the power module 30, the plurality of conductors 42 includes an eighth exemplary DC positive conductor 114a, a fifteenth exemplary DC negative conductor 114b, a sixteenth exemplary DC negative conductor 114c, and an eighth exemplary AC conductor 114d disposed on the dielectric substrate as shown in FIG. 6B.

In the eighth exemplary embodiment 30h of the power module 30, the plurality of high-side semiconductor devices 44a are oriented as shown in FIG. 6B. More particularly, in the eighth exemplary embodiment 30h of the power module 30, the first high-side semiconductor device 52a is oriented with the first edge 54a of the first high-side semiconductor device 52a parallel to the second edge 50b of the dielectric substrate 40 and with the second edge 54b of the first high-side semiconductor device 52a parallel to the fourth edge 50d of the dielectric substrate 40. In the eighth exemplary embodiment 30h of the power module 30, the second high-side semiconductor device 52b is oriented with the first edge 58a of the second high-side semiconductor device 52b parallel to the second edge 50b of the dielectric substrate 40 and with the second edge 58b of the second high-side semiconductor device 52b parallel to the fourth edge 50d of the dielectric substrate 40.

In the eighth exemplary embodiment 30h of the power module 30, the first terminal 56a of the first high-side semiconductor device 52*a* and the first terminal 60*a* of the second high-side semiconductor device 52*b* are electrically connected to the eighth exemplary DC positive conductor 114*a* such that a fifteenth exemplary high-side conduction path length 116*a* between the first terminal 56*a* of the first high-side semiconductor device 52*a* and the positive terminal end 32*a* is equal to a sixteenth exemplary high-side conduction path length 116*b* between the first terminal 60*a* of the second high-side semiconductor device 52*b* and the positive terminal end 32*a*. In the scope of the present disclosure, a conduction path length is a mean length of a path along which electrons travel between two points. It should be understood that the shape and scale of the fifteenth exemplary high-side conduction path length 116*a* and the sixteenth exemplary high-side conduction path length 116*b* shown in FIG. 6B are merely exemplary in nature.

In an exemplary embodiment, the eighth exemplary DC positive conductor 114*a* is shaped symmetrically such that a first volume of conductor between the first terminal 56*a* of the first high-side semiconductor device 52*a* and the positive terminal end 32*a* is equal to a second volume of conductor between the first terminal 60*a* of the second high-side semiconductor device 52*b* and the positive terminal end 32*a*.

In an exemplary embodiment, the eighth exemplary DC positive conductor 114*a* is shaped symmetrically such that a first parasitic inductance measured between the first terminal 56*a* of the first high-side semiconductor device 52*a* and the positive terminal end 32*a* is equal to a second parasitic inductance measured between the first terminal 60*a* of the second high-side semiconductor device 52*b* and the positive terminal end 32*a*.

In the eighth exemplary embodiment 30*h* of the power module 30, the second terminal 56*b* of the first high-side semiconductor device 52*a* is electrically connected to the eighth exemplary AC conductor 114*d*. The second terminal 60*b* of the second high-side semiconductor device 52*b* is electrically connected to the eighth exemplary AC conductor 114*d*. In the eighth exemplary embodiment 30*h* of the power module 30, the eighth exemplary AC conductor 114*d* is shaped such as to allow a mechanical connection between the eighth exemplary AC conductor 114*d* and the first high-side semiconductor device 52*a* and the second high-side semiconductor device 52*b*. In a non-limiting example, the first high-side semiconductor device 52*a* mounted to the eighth exemplary AC conductor 114*d* using soldering or sintering. In a non-limiting example, the second high-side semiconductor device 52*b* is mounted to the eighth exemplary AC conductor 114*d* using soldering or sintering.

In the eighth exemplary embodiment 30*h* of the power module 30, the plurality of low-side semiconductor devices 44*b* are oriented as shown in FIG. 6B. More particularly, in the eighth exemplary embodiment 30*h* of the power module 30, the first low-side semiconductor device 62*a* is oriented with the first edge 64*a* of the first low-side semiconductor device 62*a* parallel to the first edge 50*a* of the dielectric substrate 40 and with the second edge 64*b* of the first low-side semiconductor device 62*a* parallel to the third edge 50*c* of the dielectric substrate 40. In the eighth exemplary embodiment 30*h* of the power module 30, the second low-side semiconductor device 62*b* is oriented with the first edge 68*a* of the second low-side semiconductor device 62*b* parallel to the third edge 50*c* of the dielectric substrate 40 and with the second edge 68*b* of the second low-side semiconductor device 62*b* parallel to the first edge 50*a* of the dielectric substrate 40.

In the eighth exemplary embodiment 30*h* of the power module 30, the second terminal 66*b* of the first low-side semiconductor device 62*a* is electrically connected to the fifteenth exemplary DC negative conductor 114*b*. The second terminal 70*b* of the second low-side semiconductor device 62*b* is electrically connected to the sixteenth exemplary DC negative conductor 114*c*. A fifteenth exemplary low-side conduction path length 118*a* between the second terminal 66*b* of the first low-side semiconductor device 62*a* and the first negative terminal end 32*b* is equal to a sixteenth exemplary low-side conduction path length 118*b* between the second terminal 70*b* of the second low-side semiconductor device 62*b* and the second negative terminal end 32*c*. It should be understood that the shape and scale of the fifteenth exemplary low-side conduction path length 118*a* and the sixteenth exemplary low-side conduction path length 118*b* shown in FIG. 6B are merely exemplary in nature.

In an exemplary embodiment, the fifteenth exemplary DC negative conductor 114*b* is shaped symmetrically with the sixteenth exemplary DC negative conductor 114*c* such that a third volume of conductor between the second terminal 66*b* of the first low-side semiconductor device 62*a* and the first negative terminal end 32*b* is equal to a fourth volume of conductor between the second terminal 70*b* of the second low-side semiconductor device 62*b* and the second negative terminal end 32*c*.

In an exemplary embodiment, the fifteenth exemplary DC negative conductor 114*b* is shaped symmetrically with the sixteenth exemplary DC negative conductor 114*c* such that a third parasitic inductance measured between the second terminal 66*b* of the first low-side semiconductor device 62*a* and the first negative terminal end 32*b* is equal to a fourth parasitic inductance measured between the second terminal 70*b* of the second low-side semiconductor device 62*b* and the second negative terminal end 32*c*.

In the eighth exemplary embodiment 30*h* of the power module 30, the fifteenth exemplary DC negative conductor 114*b* is shaped such as to allow a mechanical connection between the fifteenth exemplary DC negative conductor 114*b* and the first low-side semiconductor device 62*a*. The sixteenth exemplary DC negative conductor 114*c* is shaped such as to allow a mechanical connection between the sixteenth exemplary DC negative conductor 114*c* and the second low-side semiconductor device 62*b*. In a non-limiting example, the first low-side semiconductor device 62*a* is mounted to the fifteenth exemplary DC negative conductor 114*b* using soldering or sintering. In a non-limiting example, the second low-side semiconductor device 62*b* is mounted to the sixteenth exemplary DC negative conductor 114*c* using soldering or sintering.

In the eighth exemplary embodiment 30*h* of the power module 30, the first terminal 66*a* of the first low-side semiconductor device 62*a* is electrically connected to the eighth exemplary AC conductor 114*d*. The first terminal 70*a* of the second low-side semiconductor device 62*b* is electrically connected to the eighth exemplary AC conductor 114*d*.

Figure 7:
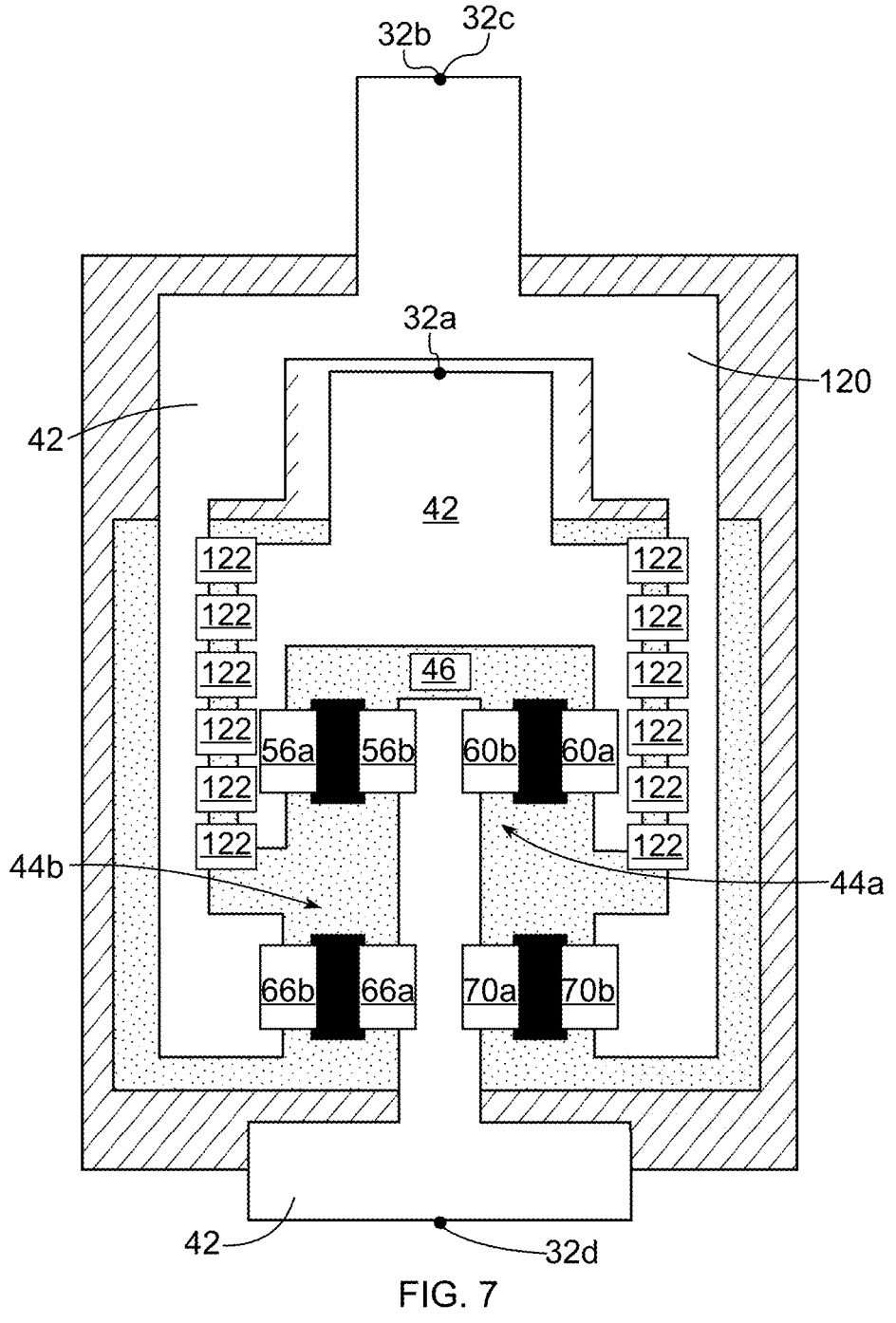
FIG. 7 is a schematic diagram of a ninth exemplary embodiment of the power module, according to an exemplary embodiment.

Referring to FIG. 7, a schematic diagram of a ninth exemplary embodiment 30*i* of the power module 30 is shown. The ninth exemplary embodiment 30*i* of the power module 30 illustrates how the DC negative conductors of any of the previously discussed embodiments may be electrically connected to form a single combined DC negative conductor 120. This allows the power module 30 to be connected to external circuits as a two-terminal device.

It should be understood that the single combined DC negative conductor 120 shown in FIG. 7 is merely exemplary in nature, and that any shape or size of single combined DC negative conductor 120 may be used. In an exemplary embodiment, the first negative terminal end 32*b*, the second negative terminal end 32c, and the positive terminal end 32a are positioned in a laminated structure to reduce parasitic inductance by canceling electromagnetic fields.

The ninth exemplary embodiment 30i of the power module 30 further illustrates how the embodiments of the power module 30 of the present disclosure allow for symmetrical placement of large numbers of decoupling capacitors 122 between the DC positive conductors and the DC negative conductors. The symmetrical placement of the decoupling capacitors 122 ensures that each of the plurality of high-side semiconductor devices 44a and each of the plurality of low-side semiconductor devices 44b see a same decoupling capacitance symmetrically and evenly distributed near the plurality of high-side semiconductor devices 44a and the plurality of low-side semiconductor devices 44b.

While the arrangement of the plurality of conductors 42, the plurality of high-side semiconductor devices 44a, and the plurality of low-side semiconductor devices 44b in the ninth exemplary embodiment 30i of the power module 30 shown in FIG. 7 is similar to the first exemplary embodiment 30a of the power module 30, it should be understood that the disclosure provided above with reference to FIG. 7 and the ninth exemplary embodiment 30i of the power module 30 is applicable to all of the previously discussed embodiments.

It should be understood that any combination of the aforementioned embodiments of the power module 30 may be used to realize the inverter 20. It should further be understood that any of the aforementioned embodiments of the power module 30 may also be used to realize other power electronic devices such as, for example, rectifiers, DC-DC converters, and/or the like.

The system 10 and power module 30 of the present disclosure offer several advantages. In the power module 30 of the present disclosure, each semiconductor device sees the same parasitics (i.e., parasitic inductance, parasitic capacitance, and parasitic resistance), resulting in balanced current flow, voltage distributions, and temperature distributions. The balanced parasitics also have the effect of reducing voltage overshoot caused by switching, thus mitigating switching loss, component damage, and electromagnetic interference (EMI) issues. Furthermore, the symmetrical design of the power module 30 of the present disclosure allows for large numbers of symmetrically placed decoupling capacitors.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A power module comprising:
   a dielectric substrate;
   a plurality of conductors disposed on the dielectric substrate, wherein the plurality of conductors includes one or more direct current (DC) positive conductors, one or more DC negative conductors, and one or more alternating current (AC) conductors;
   a plurality of terminal ends configured for connection to an external circuit, wherein each of the plurality of terminal ends is in electrical communication with one of the plurality of conductors;
   a plurality of high-side semiconductor devices disposed on the dielectric substrate, wherein each of the plurality of high-side semiconductor devices has a first terminal and a second terminal, wherein the first terminal of each of the plurality of high-side semiconductor devices is connected to one of the one or more DC positive conductors, wherein a high-side conduction path length between the first terminal of each of the plurality of high-side semiconductor devices and the plurality of terminal ends is equal, and wherein the second terminal of each of the plurality of high-side semiconductor devices is connected to one of the one or more AC conductors; and
   a plurality of low-side semiconductor devices disposed on the dielectric substrate, wherein each of the plurality of low-side semiconductor devices has a first terminal and a second terminal, wherein the first terminal of each of the plurality of low-side semiconductor devices is connected to one of the one or more AC conductors, wherein the second terminal of each of the plurality of low-side semiconductor devices is connected to one of the one or more DC negative conductors, and wherein a low-side conduction path length between the second terminal of each of the plurality of low-side semiconductor devices and the plurality of terminal ends is equal.

2. The power module of claim 1, wherein the plurality of conductors further comprises:
   a DC positive conductor;
   a first DC negative conductor;
   a second DC negative conductor; and
   an AC conductor; and
wherein the plurality of terminal ends further comprises:
   a positive terminal end in electrical communication with the DC positive conductor;
   a first negative terminal end in electrical communication with the first DC negative conductor; and
   a second negative terminal end in electrical communication with the second DC negative conductor.

3. The power module of claim 2, wherein the plurality of high-side semiconductor devices further comprises:
   a first high-side semiconductor device, wherein the first terminal of the first high-side semiconductor device is connected to the DC positive conductor and wherein the second terminal of the first high-side semiconductor device is connected to the AC conductor;
   a second high-side semiconductor device, wherein the first terminal of the second high-side semiconductor device is connected to the DC positive conductor and wherein the second terminal of the second high-side semiconductor device is connected to the AC conductor; and
   wherein a first high-side conduction path length between the first terminal of the first high-side semiconductor device and the positive terminal end is equal to a second high-side conduction path length between the first terminal of the second high-side semiconductor device and the positive terminal end.

4. The power module of claim 3, wherein the plurality of low-side semiconductor devices further comprises:
   a first low-side semiconductor device, wherein the first terminal of the first low-side semiconductor device is connected to the AC conductor and wherein the second terminal of the first low-side semiconductor device is connected to the first DC negative conductor;
   a second low-side semiconductor device, wherein the first terminal of the second low-side semiconductor device is connected to the AC conductor and wherein the second terminal of the second low-side semiconductor device is connected to the second DC negative conductor; and wherein a first low-side conduction path length between the second terminal of the first low-side semiconductor device and the first negative terminal end is equal to a second low-side conduction path length between the second terminal of the second low-side semiconductor device and the second negative terminal end.

5. The power module of claim 4, wherein:
the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge;
the first high-side semiconductor device has a first edge and a second edge, wherein the first terminal of the first high-side semiconductor device is disposed on the first edge of the first high-side semiconductor device and the second terminal of the first high-side semiconductor device is disposed on the second edge of the first high-side semiconductor device;
the second high-side semiconductor device has a first edge and a second edge, wherein the first terminal of the second high-side semiconductor device is disposed on the first edge of the second high-side semiconductor device and the second terminal of the second high-side semiconductor device is disposed on the second edge of the second high-side semiconductor device;
the first low-side semiconductor device has a first edge and a second edge, wherein the first terminal of the first low-side semiconductor device is disposed on the first edge of the first low-side semiconductor device and the second terminal of the first low-side semiconductor device is disposed on the second edge of the first low-side semiconductor device; and
the second low-side semiconductor device has a first edge and a second edge, wherein the first terminal of the second low-side semiconductor device is disposed on the first edge of the second low-side semiconductor device and the second terminal of the second low-side semiconductor device is disposed on the second edge of the second low-side semiconductor device.

6. The power module of claim 5, wherein:
the first high-side semiconductor device is oriented with the first edge of the first high-side semiconductor device parallel to the third edge of the dielectric substrate and with the second edge of the first high-side semiconductor device parallel to the first edge of the dielectric substrate;
the second high-side semiconductor device is oriented with the first edge of the second high-side semiconductor device parallel to the first edge of the dielectric substrate and with the second edge of the second high-side semiconductor device parallel to the third edge of the dielectric substrate;
the first low-side semiconductor device is oriented with the first edge of the first low-side semiconductor device parallel to the first edge of the dielectric substrate and with the second edge of the first low-side semiconductor device parallel to the third edge of the dielectric substrate; and
the second low-side semiconductor device is oriented with the first edge of the second low-side semiconductor device parallel to the third edge of the dielectric substrate and with the second edge of the second low-side semiconductor device parallel to the first edge of the dielectric substrate.

7. The power module of claim 5, wherein:
the first high-side semiconductor device is oriented with the first edge of the first high-side semiconductor device parallel to the second edge of the dielectric substrate and with the second edge of the first high-side semiconductor device parallel to the fourth edge of the dielectric substrate;
the second high-side semiconductor device is oriented with the first edge of the second high-side semiconductor device parallel to the second edge of the dielectric substrate and with the second edge of the second high-side semiconductor device parallel to the fourth edge of the dielectric substrate;
the first low-side semiconductor device is oriented with the first edge of the first low-side semiconductor device parallel to the fourth edge of the dielectric substrate and with the second edge of the first low-side semiconductor device parallel to the second edge of the dielectric substrate; and
the second low-side semiconductor device is oriented with the first edge of the second low-side semiconductor device parallel to the fourth edge of the dielectric substrate and with the second edge of the second low-side semiconductor device parallel to the second edge of the dielectric substrate.

8. The power module of claim 5, wherein:
the first high-side semiconductor device is oriented with the first edge of the first high-side semiconductor device parallel to the third edge of the dielectric substrate and with the second edge of the first high-side semiconductor device parallel to the first edge of the dielectric substrate;
the second high-side semiconductor device is oriented with the first edge of the second high-side semiconductor device parallel to the first edge of the dielectric substrate and with the second edge of the second high-side semiconductor device parallel to the third edge of the dielectric substrate;
the first low-side semiconductor device is oriented with the first edge of the first low-side semiconductor device parallel to the fourth edge of the dielectric substrate and with the second edge of the first low-side semiconductor device parallel to the second edge of the dielectric substrate; and
the second low-side semiconductor device is oriented with the first edge of the second low-side semiconductor device parallel to the fourth edge of the dielectric substrate and with the second edge of the second low-side semiconductor device parallel to the second edge of the dielectric substrate.

9. The power module of claim 5, wherein:
the first high-side semiconductor device is oriented with the first edge of the first high-side semiconductor device parallel to the second edge of the dielectric substrate and with the second edge of the first high-side semiconductor device parallel to the fourth edge of the dielectric substrate;
the second high-side semiconductor device is oriented with the first edge of the second high-side semiconductor device parallel to the second edge of the dielectric substrate and with the second edge of the second high-side semiconductor device parallel to the fourth edge of the dielectric substrate;
the first low-side semiconductor device is oriented with the first edge of the first low-side semiconductor device parallel to the first edge of the dielectric substrate and with the second edge of the first low-side semiconductor device parallel to the third edge of the dielectric substrate; and the second low-side semiconductor device is oriented with the first edge of the second low-side semiconductor device parallel to the third edge of the dielectric substrate and with the second edge of the second low-side semiconductor device parallel to the first edge of the dielectric substrate.

10. The power module of claim 1, wherein:

each of the plurality of high-side semiconductor devices is mechanically connected to the plurality of conductors using soldering or sintering; and each of the plurality of low-side semiconductor devices is mechanically connected to the plurality of conductors using soldering or sintering.

11. A power system for a vehicle, the power system comprising:

a rechargeable energy storage system (RESS) operable to provide direct current (DC) energy;

a traction motor operable convert alternating current (AC) energy to mechanical energy to propel the vehicle; and an inverter in electrical communication with the RESS and the traction motor and operable to convert the DC energy from the RESS to AC energy to power the traction motor, the inverter including:

a dielectric substrate including at least one of: a direct bonded copper (DBC) substrate and an active metal brazed (AMB) substrate;

a DC positive conductor having a positive terminal end in electrical communication with the DC positive conductor and the RESS, wherein the DC positive conductor is disposed on the dielectric substrate;

a DC negative conductor having a negative terminal end in electrical communication with the DC negative conductor and the RESS, wherein the DC negative conductor is disposed on the dielectric substrate;

an AC conductor having an AC terminal end in electrical communication with the AC conductor and the traction motor, wherein the AC conductor is disposed on the dielectric substrate;

a plurality of high-side semiconductor devices disposed on the dielectric substrate, wherein each of the plurality of high-side semiconductor devices has a first terminal and a second terminal, wherein the first terminal of each of the plurality of high-side semiconductor devices is connected to the DC positive conductor, wherein a high-side conduction path length between the first terminal of each of the plurality of high-side semiconductor devices and the positive terminal end is equal, and wherein the second terminal of each of the plurality of high-side semiconductor devices is connected to the AC conductor; and a plurality of low-side semiconductor devices disposed on the dielectric substrate, wherein each of the plurality of low-side semiconductor devices has a first terminal and a second terminal, wherein the first terminal of each of the plurality of low-side semiconductor devices is connected to the AC conductor, wherein the second terminal of each of the plurality of low-side semiconductor devices is connected to the DC negative conductor, and wherein a low-side conduction path length between the second terminal of each of the plurality of low-side semiconductor devices and the negative terminal end is equal.

12. The inverter of claim 11, wherein:

the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge;

the plurality of high-side semiconductor devices each have a first edge and a second edge, wherein the first terminal of each of the plurality of high-side semiconductor devices is disposed on the first edge of each of the plurality of high-side semiconductor devices and the second terminal of each of the plurality of high-side semiconductor devices is disposed on the second edge of each of the plurality of high-side semiconductor devices; and the plurality of low-side semiconductor devices each have a first edge and a second edge, wherein the first terminal of each of the plurality of low-side semiconductor devices is disposed on the first edge of each of the plurality of low-side semiconductor devices and the second terminal of each of the plurality of low-side semiconductor devices is disposed on the second edge of each of the plurality of low-side semiconductor devices.

13. The inverter of claim 12, wherein:

the plurality of high-side semiconductor devices are oriented with the first edge of each of the plurality of high-side semiconductor devices parallel to the third edge of the dielectric substrate and with the second edge of each of the plurality of high-side semiconductor devices parallel to the first edge of the dielectric substrate; and the plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

14. The inverter of claim 12, wherein:

the plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate; and the plurality of low-side semiconductor devices is oriented with the first edge of each of the plurality of low-side semiconductor devices parallel to the fourth edge of the dielectric substrate and with the second edge of each of the plurality of low-side semiconductor devices parallel to the second edge of the dielectric substrate.

15. The inverter of claim 12, wherein:

the plurality of high-side semiconductor devices are oriented with the first edge of each of the plurality of high-side semiconductor devices parallel to the third edge of the dielectric substrate and with the second edge of each of the plurality of high-side semiconductor devices parallel to the first edge of the dielectric substrate; and the plurality of low-side semiconductor devices are oriented with the first edge of each of the plurality of low-side semiconductor devices parallel to the fourth edge of the dielectric substrate and with the second edge of each of the plurality of low-side semiconductor devices parallel to the second edge of the dielectric substrate.

16. The inverter of claim 12, wherein:

the plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate; and the plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

17. The inverter of claim 11, wherein:

each of the plurality of high-side semiconductor devices is mechanically connected to the AC conductor; and each of the plurality of low-side semiconductor devices is mechanically connected to the DC negative conductor.

18. An inverter for a vehicle, the inverter comprising:

a dielectric substrate including at least one of: a direct bonded copper (DBC) substrate and an active metal brazed (AMB) substrate;

a DC positive conductor having a positive terminal end in electrical communication with the DC positive conductor, wherein the DC positive conductor is disposed on the dielectric substrate;

a DC negative conductor having a negative terminal end in electrical communication with the DC negative conductor, wherein the DC negative conductor is disposed on the dielectric substrate;

an AC conductor having an AC terminal end in electrical communication with the AC conductor, wherein the AC conductor is disposed on the dielectric substrate;

a plurality of high-side semiconductor devices disposed on the dielectric substrate, wherein each of the plurality of high-side semiconductor devices has a first terminal and a second terminal, wherein the first terminal of each of the plurality of high-side semiconductor devices is connected to the DC positive conductor, wherein a high-side conduction path length between the first terminal of each of the plurality of high-side semiconductor devices and the positive terminal end is equal, and wherein the second terminal of each of the plurality of high-side semiconductor devices is connected to the AC conductor; and a plurality of low-side semiconductor devices disposed on the dielectric substrate, wherein each of the plurality of low-side semiconductor devices has a first terminal and a second terminal, wherein the first terminal of each of the plurality of low-side semiconductor devices is connected to the AC conductor, wherein the second terminal of each of the plurality of low-side semiconductor devices is connected to the DC negative conductor, and wherein a low-side conduction path length between the second terminal of each of the plurality of low-side semiconductor devices and the negative terminal end is equal.

19. The inverter of claim 18, wherein:

the dielectric substrate is a rectangle having a first edge, a second edge perpendicular to the first edge, a third edge parallel to the first edge and perpendicular to the second edge, and a fourth edge parallel to the second edge and perpendicular to the first edge and the third edge;

the plurality of high-side semiconductor devices each have a first edge and a second edge, wherein the first terminal of each of the plurality of high-side semiconductor devices is disposed on the first edge of each of the plurality of high-side semiconductor devices and the second terminal of each of the plurality of high-side semiconductor devices is disposed on the second edge of each of the plurality of high-side semiconductor devices, and wherein the plurality of high-side semiconductor devices are oriented with the first edge of each of the plurality of high-side semiconductor devices parallel to the second edge of the dielectric substrate and with the second edge of each of the plurality of high-side semiconductor devices parallel to the fourth edge of the dielectric substrate; and the plurality of low-side semiconductor devices each have a first edge and a second edge, wherein the first terminal of each of the plurality of low-side semiconductor devices is disposed on the first edge of each of the plurality of low-side semiconductor devices and the second terminal of each of the plurality of low-side semiconductor devices is disposed on the second edge of each of the plurality of low-side semiconductor devices, and wherein the plurality of low-side semiconductor devices are oriented with the first edge of each of the plurality of low-side semiconductor devices parallel to the first edge of the dielectric substrate and with the second edge of each of the plurality of low-side semiconductor devices parallel to the third edge of the dielectric substrate.

20. The inverter of claim 12, wherein:

each of the plurality of high-side semiconductor devices is mechanically connected to the AC conductor using soldering or sintering; and each of the plurality of low-side semiconductor devices is mechanically connected to the DC negative conductor using soldering or sintering.

* * * * *